United States Patent
Roucka et al.

(10) Patent No.: US 11,271,122 B2
(45) Date of Patent: Mar. 8, 2022

(54) SHORT WAVELENGTH INFRARED OPTOELECTRONIC DEVICES HAVING A DILUTE NITRIDE LAYER

(71) Applicant: ARRAY PHOTONICS, INC., Tempe, AZ (US)

(72) Inventors: Radek Roucka, East Palo Alto, CA (US); Sabeur Siala, Sunnyvale, CA (US); Aymeric Maros, San Francisco, CA (US); Ting Liu, San Jose, CA (US); Ferran Suarez, Chandler, AZ (US); Evan Pickett, Menlo Park, CA (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 17 days.

(21) Appl. No.: 16/812,668

(22) Filed: Mar. 9, 2020

(65) Prior Publication Data
US 2020/0212237 A1    Jul. 2, 2020

Related U.S. Application Data

(63) Continuation of application No. PCT/US2018/052873, filed on Sep. 26, 2018.
(Continued)

(51) Int. Cl.
*H01L 31/0304*    (2006.01)
*H01L 27/144*    (2006.01)
(Continued)

(52) U.S. Cl.
CPC .... *H01L 31/03046* (2013.01); *H01L 27/1446* (2013.01); *H01L 31/1844* (2013.01); *H01L 33/30* (2013.01)

(58) Field of Classification Search
CPC .......... H01L 31/03046; H01L 31/1844; H01L 31/105; H01L 31/107; H01L 31/03048;
(Continued)

(56) References Cited

U.S. PATENT DOCUMENTS 4,127,862 A    11/1978  Ilegmes et al.
4,179,702 A    12/1979  Lamorte
(Continued)

FOREIGN PATENT DOCUMENTS

CN    1917241 A    2/2007
CN    102280587 A    12/2011
(Continued)

OTHER PUBLICATIONS

Tukiainen et. al "High Efficiency Dilute Nitride Solar Cells: Simulations Meet Experiments", Journal of Green Engineering, vol. 5, Article No. 8 p. 113-132 Jul. 2015 . Retrieved from the Internet:< URL:https://www.riverpublishers.com/journal_read_html_article.php?j=JGE/5/4/8> (Year: 2015).*
(Continued)

*Primary Examiner* — Sitaramarao S Yechuri
(74) *Attorney, Agent, or Firm* — Morrison & Foerster LLP

(57) ABSTRACT

Semiconductor optoelectronic devices having a dilute nitride active layer are disclosed. In particular, the semiconductor devices have a dilute nitride active layer with a bandgap within a range from 0.7 eV and 1 eV. Photodetectors comprising a dilute nitride active layer have a responsivity of greater than 0.6 A/W at a wavelength of 1.3 μm.

24 Claims, 10 Drawing Sheets

Related U.S. Application Data

(60) Provisional application No. 62/564,124, filed on Sep. 27, 2017.

(51) Int. Cl.
*H01L 31/18* (2006.01)
*H01L 33/30* (2010.01)

(58) Field of Classification Search
CPC ... H01L 27/1446; H01L 33/30; H01L 33/007; H01L 33/0075; H01L 33/32
See application file for complete search history.

(56) References Cited

U.S. PATENT DOCUMENTS

| | | | |
|---|---|---|---|
| 4,404,421 A | 9/1983 | Fraas | |
| 4,547,622 A | 10/1985 | Fan et al. | |
| 4,682,196 A | 7/1987 | Sakai et al. | |
| 4,881,979 A | 11/1989 | Lewis | |
| 4,935,384 A | 6/1990 | Wanlass | |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |
| 6,069,353 A | 5/2000 | Jung et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 | 12/2003 | Patton et al. | |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,045,833 B2 | 5/2006 | Campbell et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,161,170 B1 | 1/2007 | Yoder | |
| 7,255,746 B2 | 8/2007 | Johnson et al. | |
| 7,279,732 B2 | 10/2007 | Meng et al. | |
| 7,473,941 B2 | 1/2009 | Lester et al. | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Comfeld et al. | |
| 8,029,905 B2 | 10/2011 | Kouvetakis et al. | |
| 8,067,687 B2 | 11/2011 | Wanlass | |
| 8,093,559 B1 | 1/2012 | Rajavel | |
| 8,575,473 B2 | 11/2013 | Jones et al. | |
| 8,636,844 B1 | 1/2014 | Dargis et al. | |
| 8,697,481 B2 | 4/2014 | Jones-Albertus et al. | |
| 8,716,593 B2 | 5/2014 | Meusel et al. | |
| 8,809,673 B2 | 8/2014 | Lin et al. | |
| 8,895,838 B1 | 11/2014 | Welser | |
| 8,912,433 B2 | 12/2014 | Jones et al. | |
| 8,957,376 B1 | 2/2015 | Tkachuk et al. | |
| 8,962,993 B2 | 2/2015 | Jones-Albertus et al. | |
| 9,018,521 B1 | 4/2015 | Cornfeld | |
| 9,153,724 B2 | 10/2015 | Jones-Albertus et al. | |
| 9,214,580 B2 | 12/2015 | Misra et al. | |
| 9,240,514 B2 | 1/2016 | Gori et al. | |
| 9,252,313 B2 | 2/2016 | Meusel et al. | |
| 9,257,586 B2 | 2/2016 | Meusel et al. | |
| 9,502,598 B2 | 11/2016 | Meusel et al. | |
| 9,741,888 B2 | 8/2017 | Meusel et al. | |
| 9,748,426 B2 | 8/2017 | Meusel et al. | |
| 9,768,339 B2 | 9/2017 | Yanka et al. | |
| 10,355,159 B2 | 7/2019 | Misra et al. | |
| 2002/0000546 A1 | 1/2002 | Sato | |
| 2002/0117675 A1 | 8/2002 | Mascarenhas | |
| 2002/0195137 A1 | 12/2002 | King et al. | |
| 2003/0047752 A1 | 3/2003 | Campbell et al. | |
| 2003/0070707 A1 | 4/2003 | King et al. | |
| 2003/0145884 A1 | 8/2003 | King et al. | |
| 2004/0045598 A1 | 3/2004 | Narayanan et al. | |
| 2004/0079408 A1 | 4/2004 | Fetzer | |
| 2004/0130002 A1 | 7/2004 | Weeks et al. | |
| 2004/0187912 A1 | 9/2004 | Takamoto | |
| 2004/0200523 A1 | 10/2004 | King et al. | |
| 2005/0139863 A1 | 6/2005 | Welser et al. | |
| 2005/0155641 A1 | 7/2005 | Fafard | |
| 2005/0274409 A1 | 12/2005 | Fetzer et al. | |
| 2006/0048811 A1 | 3/2006 | Krut | |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0113887 A1 | 5/2007 | Laih et al. | |
| 2007/0131275 A1 | 6/2007 | Kinsey et al. | |
| 2007/0212510 A1 | 9/2007 | Hieslmair et al. | |
| 2007/0227588 A1 | 10/2007 | Gossard et al. | |
| 2007/0246701 A1 | 10/2007 | Yanson et al. | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1 | 1/2009 | Nagai et al. | |
| 2009/0014061 A1* | 1/2009 | Harris, Jr. ........... H01L 31/0304 136/255 |
| 2009/0057721 A1 | 3/2009 | Miura et al. | |
| 2009/0078310 A1 | 3/2009 | Stan et al. | |
| 2009/0145476 A1 | 6/2009 | Fetzer et al. | |
| 2009/0155952 A1 | 6/2009 | Stan et al. | |
| 2009/0188561 A1 | 7/2009 | Aiken et al. | |
| 2009/0218595 A1 | 9/2009 | Ishimura et al. | |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0072457 A1 | 3/2010 | Iguchi et al. | |
| 2010/0087028 A1 | 4/2010 | Porthouse et al. | |
| 2010/0096001 A1 | 4/2010 | Sivananthan et al. | |
| 2010/0096665 A1 | 4/2010 | MacDougal et al. | |
| 2010/0116318 A1 | 5/2010 | Sumida et al. | |
| 2010/0147366 A1 | 6/2010 | Stan et al. | |
| 2010/0180936 A1 | 7/2010 | Kim | |
| 2010/0186818 A1 | 7/2010 | Okorogu et al. | |
| 2010/0218819 A1 | 9/2010 | Farmer et al. | |
| 2010/0282305 A1 | 11/2010 | Sharps et al. | |
| 2010/0282306 A1 | 11/2010 | Sharps et al. | |
| 2010/0319764 A1 | 12/2010 | Wiemer et al. | |
| 2011/0023958 A1 | 2/2011 | Masson et al. | |
| 2011/0039400 A1 | 2/2011 | Yoon et al. | |
| 2011/0073973 A1 | 3/2011 | Nakaji et al. | |
| 2011/0114163 A1 | 5/2011 | Wiemer et al. | |
| 2011/0210313 A1 | 9/2011 | Fuji et al. | |
| 2011/0232730 A1 | 9/2011 | Jones et al. | |
| 2011/0254052 A1 | 10/2011 | Kouvetakis et al. | |
| 2011/0291109 A1 | 12/2011 | Wraback et al. | |
| 2011/0303268 A1 | 12/2011 | Tan et al. | |
| 2012/0031478 A1 | 2/2012 | Boisvert et al. | |
| 2012/0103403 A1 | 5/2012 | Misra et al. | |
| 2012/0153417 A1 | 6/2012 | Jin-Wei et al. | |
| 2012/0167965 A1 | 7/2012 | Lin et al. | |
| 2012/0211071 A1 | 8/2012 | Newman et al. | |
| 2012/0216858 A1 | 8/2012 | Jones-Albertus et al. | |
| 2012/0216862 A1 | 8/2012 | Abou-Kandil et al. | |

(56) References Cited

U.S. PATENT DOCUMENTS

| | | |
|---|---|---|
| 2012/0227797 A1 | 9/2012 | Stan et al. |
| 2012/0255600 A1 | 10/2012 | Bedell et al. |
| 2012/0266803 A1 | 10/2012 | Zediker |
| 2012/0285526 A1 | 11/2012 | Jones-Albertus et al. |
| 2013/0014815 A1 | 1/2013 | Jones-Albertus et al. |
| 2013/0074901 A1 | 3/2013 | Walukiewicz et al. |
| 2013/0112239 A1 | 5/2013 | Liptac et al. |
| 2013/0118546 A1 | 5/2013 | Jones-Albertus et al. |
| 2013/0118566 A1 | 5/2013 | Jones-Albertus et al. |
| 2013/0220409 A1 | 5/2013 | Jones-Albertus et al. |
| 2013/0344645 A1 | 12/2013 | Ahmari |
| 2014/0182667 A1 | 7/2014 | Richards et al. |
| 2014/0261653 A1 | 9/2014 | Krause et al. |
| 2014/0290737 A1* | 10/2014 | Javey ............... H01L 31/1852 136/256 |
| 2014/0326300 A1 | 11/2014 | Fuhrmann |
| 2015/0187971 A1 | 7/2015 | Sweeney et al. |
| 2015/0214412 A1 | 7/2015 | Jones-Albertus et al. |
| 2015/0221803 A1 | 8/2015 | Suarez et al. |
| 2015/0357501 A1 | 12/2015 | Derkacs et al. |
| 2015/0372178 A1 | 12/2015 | Jones-albertus et al. |
| 2016/0005909 A1 | 1/2016 | Newman |
| 2016/0118526 A1 | 4/2016 | Misra et al. |
| 2016/0190376 A1 | 6/2016 | Campesato et al. |
| 2016/0300973 A1 | 10/2016 | Shen et al. |
| 2016/0372624 A1 | 12/2016 | Yanka et al. |
| 2017/0036572 A1 | 2/2017 | Hansen et al. |
| 2017/0110607 A1* | 4/2017 | Jones-Albertus ... H01L 31/1852 |
| 2017/0110613 A1 | 4/2017 | Suarez et al. |
| 2017/0200845 A1 | 7/2017 | King et al. |
| 2017/0271542 A1* | 9/2017 | Fafard ................ H01L 31/14 |
| 2017/0338357 A1 | 11/2017 | Liu et al. |
| 2018/0337301 A1 | 11/2018 | Suarez Arias |
| 2019/0013430 A1* | 1/2019 | Jones-Albertus ..... H01L 31/109 |
| 2019/0252567 A1 | 8/2019 | Yoon et al. |
| 2019/0348562 A1 | 11/2019 | Suarez Arias |

FOREIGN PATENT DOCUMENTS

| | | |
|---|---|---|
| CN | 102829884 A | 12/2012 |
| CN | 103426965 A | 12/2013 |
| CN | 104282793 A | 1/2015 |
| CN | 106711253 A | 5/2017 |
| CN | 107644921 A | 1/2018 |
| EP | 595634 B1 | 5/1994 |
| EP | 3159935 A2 | 4/2017 |
| JP | 63100781 A | 5/1988 |
| JP | 6061513 A | 3/1994 |
| JP | 6061516 A | 3/1994 |
| JP | 10012905 A | 1/1998 |
| JP | 2006-270060 A | 10/2006 |
| JP | 2008-270760 A | 11/2008 |
| TW | 200721518 A | 6/2007 |
| TW | 200924214 A | 6/2009 |
| TW | 2500933913 A | 8/2009 |
| TW | 201131788 A | 9/2011 |
| TW | 201228004 A | 7/2012 |
| TW | 201316382 A | 4/2013 |
| TW | 201436252 A | 9/2014 |
| WO | 2010/130421 A1 | 11/2010 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |
| WO | 2018/078348 A1 | 5/2018 |
| WO | 2019/067553 A1 | 4/2019 |
| WO | 2020247691 A1 | 12/2020 |

OTHER PUBLICATIONS

Aho et al., "Determination of Composition and Energy Gaps of GaInNAsSb Layers Grown by MBE," Journal of Crystal Growth, 2016, vol. 438, p. 49-54.

Aho., "Dilute Nitride Multijunction Solar Cells Grown by Molecular Beam Epitaxy," Ph.D. Dissertation, Tampere University of Technology, Nov. 2015, vol. 1343, p. 44.

Aho, Arto, "Dilute Nitride Multijunction Solar Cells Grown by Molecular Beam Epitaxy", PhD Dissertation, Tampere University of Technology, Publication, vol. 1343, Nov. 14, 2015, XP055524070, pp. 1-80.

Andreev et al., "High Current Density GaAs and GaSb Photovoltaic Cells for Laser Power Beaming", 3rd World Conference on Photovoltaic Energy conversion, May 11-18, 2003, Osaka, Japan, 4 pages.

Baghdasaryan, H.V. et al., "Wavelength-Scale Analysis of Influence of Chirped DBRs on Optical Characteristics of Multinanolayer Photovoltaic Cells," ICTON 2016, We.P.33, 5 pages.

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

Bank et al., "Recent Progress on 1.55-um Dilute-Nitride Lasers," IEEE Journal of Quantum Electronics, Sep. 2007, vol. 43, No. 9, 13 pages.

Baranowski et al., "Time-resolved photoluminescence studies of annealed 1.3-um GaInNAsSb quantum wells," Nanoscale Research Lettesr, 2014, vol. 9, No. 81, 5 pages.

Baribeau et al., "Heteroepitaxy of Ge on (100) Si substrates," Journal of Vacuum Science & Technology, Jul./Aug. 1987, A 5 (4), 6 pages.

Bertness et al., "29.5%-Efficient GaInP/GaAs Tandem Solar Cells," Applied Physics Letters, vol. 65, Aug. 22, 1994, pp. 989-991.

Bett et al., "III-V Solar Cells Under Monochromatic Illumination", IEEE transactions on Electron Devices, 2008, 5 pages.

Bhuiyan et al., "InGaN Solar Cells: Present State of the Art and Important Challenges", IEEE Journal of Photovoltaics, vol. 2, No. 3, Jul. 2012, p. 246-293.

Campesato, Roberta, et al., "31% European INGAP/GAAS/INGANAS Solar Cells for Space Application", Proceedings of the 11th European Space Power Conference 2016 (ESPC 2016), Published May 23, 2017, 5 pages.

Cheah et al., "GaAs-Based Heterojunction p-i-n Photodetectors Using Pentanary InGaAsNSb as the Intrinsic Layer," IEEE Photonics Technology Letters, Sep. 2005, vol. 17, No. 9, 3 pages.

Chang, S.J. et al., "Chirped GaAs—AlAs Distributed Bragg Reflectors for High Brightness Yellow-Green Light-Emitting Diodes," Photonics Technology Letters, Feb. 1997, vol. 9, No. 2, p. 182-184.

Chen et al., "GaAsSbN/GaAs long wavelength PIN detectors," Indium Phosphide and Related Materials, 2008, 20th International Conference on Versailles, 4 pages.

Cornfeld et al., "Evolution of a 2.05 eV AlGaInP Top Sub-cell for 5 and 6J-IMM Applications", Photovoltaic Specialists Conference (PVSC), 38th IEEE, Jun. 3, 2012, p. 2788-2791.

Cotal et al., "III-V multijunction solar cells for concentrating photovoltaics" pp. 174-192, www.rsc.org/ees, Energy and Environmental Science 2, (2009).

Dargis et al., "Growth and application of epitaxial heterostructures with polymorphous rare-earth oxides," Journal of Crystal Growth, 2013, vol. 378, p. 177-179.

Dargis et al., "Monolithic integration of rare-earth oxides and semiconductors for on-silicon technology," J. Vac. Sci. Tech., Aug. 2014, vol. 32, No. 4, p. 041506.

David et al., "Material Considerations for Avalanche Photodiodes," IEEE Journal of Selected Topics in Quantum Electronics, Jul./Aug. 2008, vol. 14, No. 4, p. 998-1009.

Denton et al., Vegard's Law, Physical Review, A, The American Physical Society, vol. 43 No. 6, pp. 3161-3164 (1991).

Edmund. "Dichroic Longpass Filters", Edmund Optics Worldwide, Product Catalog, Feb. 2001, 9 pages, retrieved from https://www.edmundoptics.com/f/dichroic-longpass-filters/14288/.

Ferguson et al., "Optical Gain in GaInNAs and GaInNAsSb Quantum Wells," IEEE Journal of Quantum Electronics, Jun. 2011, vol. 47, No. 6, 8 pages.

(56) References Cited

OTHER PUBLICATIONS

Ferguson et al., Nonradiative Recombination in 1.56 µm GaInNAsSb/GaNAs Quantum-Well Lasers, pp. 1-3, published online Dec. 8, 2009, Applied Physics Letters 95, 231104.
Fewster P.F., "X-Ray Scattering From Semiconductors" Second Edition, Imperial College Press, London, 2003, Ch. 1, pp. 1-22.
Fitzgerald et al., "Dislocations in Relaxed SiGe/Si Heterostructures," Phys. Stat. Sol., 1999, vol. 171, p. 227-238.
Friedman et al., "1-eV Solar cells with GaInNAs active layer", Journal of Crystal Growth, vol. 195, 1998, p. 409-415.
Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.
Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).
Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.
Garcia, I. et al., "Design of Semiconductor-Based Back Reflectors for High Voc Monolithic Multijunction Solar Cells," IEEE Photovoltaic Specialists Conference, Austin Texas, Jun. 3-8, 2012, 8 pages.
Garcia et al., Analysis of Tellurium as N-Type Dopant in GaInP: Doping, Diffusion, Memory Effect and Surfactant Properties, pp. 794-799, Journal of Crystal Growth 298 (2007).
Garcia et al., "Degradation of subcells and tunnel junctions during growth of GaInP/Ga(In)As/GaNAsSb/Ge 4-junction solar cells," Progress in Photovoltaics, Aug. 2017, 9 pages.
Geelen et al., Epitaxial Lift-Off GaAs Solar Cell From a Reusable GaAs Substrate, pp. 162-171, Materials Science and Engineering B45 (1997).
Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).
Gobet et al., "GaInNAsSb/GaAs vertical cavity surface-emitting lasers (VCSELs): Current challenges and techniques to realize multiple-wavelength laser arrays at 1.55um," Proc. of SPIE, Feb. 2008, vol. 6908, 13 pages.
Green et al., Progress in Photovoltaics: Research and Applications 19 (2011) pp. 565-572.
Green et al., Progress in Photovoltaics: Research and Applications 20 (2012) pp. 12-20.
Green, "Third Generation Photovoltaics: Advanced Solar Energy Conversion," pp. 95-109, Springer Publishing, Berlin, Germany (2003).
Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.
Gu et al., "Gas Source Growth and Doping Characteristics of AlInP on GaAs" Materials Science and Engineering B 131 (2006), pp. 49-53.
Gubanov et al., "Dynamic of time-resolved photoluminescence in GaInNAs and GaNAsSb solar cells," Nanoscale Research Letters, 2014, vol. 9, No. 80, 4 pages.
Han et al., "1.55 um GaInNAs resonant-cavity-enhanced photodetector grown on GaAs," Applied Physics Letters, 2005, vol. 87, 111105.
Harris Jr. et al., "Development of GainNAsSb alloys: Growth, band structure, optical properties and applications," 2007, Physics Status Solidi(b), vol. 244, Issue 8, p. 2707-2729.
Harris Jr. et al., "The opportunities, successes and challenges for GaInNAsSb," Journal of Crystal Growth, Mar. 2005, vol. 278, p. 3-17.
Heroux et al., "GaInNAs resonant-cavity-enhanced photodetector operating at 1.3 um," Applied Physics Letters, Nov. 1999, vol. 75, No. 18, p. 2716-2718.
Heroux et al., "Dilute Nitride Photodetector and Modulator Devices," Dilute III-V Nitride Semiconductors and Material Systems, Materials Science, Jan. 2008, vol. 105, pp. 563-586.
Hovel H.J., "Semiconductors and Semimetals", Academic Press, New York, 1975, Ch. 2, pp. 8-47.
Huang, Jie et al., "Four-junction AlGaAs/GaAs laser power converter," Journal of Semiconductors, Apr. 2018, vol. 39, No. 4, 044003, 5 pages.
Jackrel et al., "Thick lattice-matched GaInNAs films in photodetector applications," Proc. of SPIE, 2005, vol. 5728, p. 27-34.
Jackrel, D. B., "InGaAs and GaInNAs(Sb) 1064 NM Photodectectors and Solar Cells on GaAs Substrates," A Dissertation submitted to the Department of Materials Science and Engineering and the Committee on Graduate Studies of Stanford University, 2005, 264 pages.
Jackrel et al., "Dilute Nitride GaInNAs and GaInNAsSb Solar Cells by Molecular Beam Epitaxy," Journal of Applied Physics, 2007, vol. 101, p. 114916.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Jackrel et al., "Dilute nitride GainNAs and GainNAsSb solar cells by molecular beam epitaxy", Journal of Applied Physics 2007, 101, p. 114916.
Janotti et al., Mutual Passivation of Electrically Active and Isovalent Impurities in Dilute Nitrides, Physical Review Letters 100, 045505 (2008).
Janotti et al., "Effects of Hydrogen on the Electronic Properties of Dilute GaAsN Alloys," The American Chemical Society, Aug. 2002, vol. 89, No. 8, p. 086403.
Ketlhwaafetse, Richard, "Comparative Study of Dilute Nitride and Bismide Sub-Junctions for Tandem Solar Cells," A thesis for Ph.D. in applied physics, University of Essex, Jan. 2016, 175 pages.
Khalil et al., "Photoconductivity and photoluminescence under bias in GaInNAs/GaAs MQW p-i-n structures," Nanoscale Research Letter, 2012, vol. 7, No. 539, 4 pages.
Kim et al., "Characteristics of bulk InGaInNAs and InGaAsSbN materials grown by metal organic vapor phase epitaxy (MOVPE) for solar cell application," Proc. of SPIE, 2012, vol. 8256, 8 pages.
Kim et al., "Characteristics of bulk InGaAsSbN/GaAs grown by metalorganic vapor phase epitaxy (MOVPE)," Journal of Crystal Growth, 2013, p. 163-167.
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.
Kinsey et al., "GaNAs resonant-cavity avalanche photodiode operating at 1.064 um," Applied Physics Letters, Sep. 2000, vol. 77, No. 10, p. 1543-1544.
Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.
Kudrawiec et al., "Band Gap Discontinuity in Ga0.9In0.1N0.027As0.973—xSbx/GaAs Single Quantum Wells with 0<x<0.06 Studied by Contactless Electroreflectance Spectroscopy", Applied Physics Letters, 2006, vol. 88, p. 221113.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
Kurtz et al., "Projected Performance of Three and Four-Junction Devices Using GaAs and GaInP," pp. 875-878, 26th IEEE Photovoltaics Specialists Conference, 1997.
Langer et al., "Graded band gap GaInNAs solar cells", Applied Physics Letters, 2015, vol. 106, p. 233902.
Law et al., "Future technology pathways of terrestrial III-V multijunction solar cells for concentrator photovoltaic systems," Solar Energy Materials & Solar Cells 94 (2010) pp. 1314-1318.
Le Du et al., "Quantum-well saturable absorber at 1.55 um on GaAs substrate with a fast recombination rate," Applied Physics Letters, 2006, vol. 88, 201110.

(56) References Cited

OTHER PUBLICATIONS

Loke, W.K. et al., "Improvement of GaInNAs p-i-n photodetector responsivity by antimony incorporation," Journal of Applied Physics, 2007, vol. 101, p. 033122.

Magden et al., "Transmissive silicon photonic dichroic filters with spectrally selective eaveguides", Nature Communications, Aug. 2019, 10 pages, retrieved from https://www.nature.com/articles/s41467-018-05287-1.

Mawst et al., "Dilute-Nitride-Antimonide Materials Grown by MOVPE for Multi-Junction Solar Cell Application," The Electrochemical Society, 2015, vol. 66, No. 7, p. 101-108.

Merrill et al, Directions and Materials Challenges in High Performance Photovoltaics, Dec. 2007, JOM Energetic Thin Films, 59, 12, 26-30.

Miller et al., "GaAs—AlGaAs tunnel junctions for multigap cascade solar cells", Journal of Applied Physics, vol. 53, No. 1, Jan. 1982, p. 744-748.

Miyashita, N., et al., "Incorporation of Hydrogen into MBE-Grown Dilute Nitride GaInNAsSb Layers in a MOCVD Growth Ambient", Solar Energy Materials and Solar Cells, vol. 185, 2018, pp. 359-363.

Miyashita et al., "Generation and collection of photocarriers in dilute nitride GaInNAsSb solar cells," Progress in Photovoltaics: Research and Applications, 2016, vol. 24, p. 28-37.

Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.

Miyashita et al., "Improvement of GaInNAsSb films fabricated by atomic hydrogen-assisted molecular beam epitaxy", pp. 3249-3251, Journal of Crystal Growth 311, 2009.

Miyashita, N. et al., "Characterization of 1.0 EV GaInNAsSb Solar Cells for Multijunction Applications and the Effect of Annealing," 31st European Photovoltaic Solar Energy Conference and Exhibition, Sep. 2015, p. 1461-1465.

Ng et al., "InGaAsN as Absorber in APDs for 1.3 micron Wavelength Applications," Indium Phosphide & Related Materials, 2010 International Conference, May 2010, p. 1-4.

Ng et al., "Long wavelength bulk GaInNAs p-i-n photodiodes lattice matched to GaAs," Journal of Applied Physics, 2007, vol. 101, 064506, 6 pages.

Ng et al., "Molecular beam epitaxy growth of bulk GaNAsSb on Ge/graded-SiGe/Si substrate," Journal of Crystal Growth, 2009, vol. 311, p. 1754-1757.

Ng et al., 1EV GANXAS1-X-YSBY Material for Lattice-Matched III-V Solar Cell Implementation on GAAS and GE, pp. 76-80, (2009).

Ni et al., "Optimization of GaInNAs(Sb)/GaAs quantum wells at 1.3-1.55 um grown by molecular beam epitaxy," Journal of Crystal Growth, 2007, vol. 301-302, p. 125-128.

Niu et al., "GaAs-based room-temperature continuous-wave 1 59um GaInNAsSb single-quantum-well laser diode grown by molecular-beam epitaxy," Applied Physics Letters, Dec. 2005, vol. 87, No. 23, 4 pages.

Ochoa, M. et al., "Advances Towards 4J Lattice-Matched including Dilute Nitride Subcell for Terrestrial and Space Applications," 43rd Photovoltaic Specialists Conference, 2016, p. 52-57.

Ohnaka et al., "A Low Dark Current InGaAs/InP p-i-n Photodiode with Covered Mesa Structure," IEEE Transactions on Electron Devices, Feb. 1987, vol. Ed-34, No. 2, 6 pages.

Olson J.M. et al. "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.

Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.

Pena et al., "The Influence of Monolithic Series Connection on the Efficiency of GaAs Photovoltaic Converters for Monochromatic Illumination," Transactions on Electron Devices, Feb. 2001, vol. 48, No. 2, p. 196-203.

Polojarvi et al., "Comparative study of defect levels in GaInNAs, GaNAsSb, and GaInNAsSb for high-efficiency solar cells," Applied Physics Letters, 2016, vol. 108, p. 122104.

Ptak et al., "A comparison of MBE- and MOCVD-grown GaInNAs," Journal of Crystal Growth, 2003, vol. 251, p. 392-398.

Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).

Ptak et al., "Low-acceptor-Concentration GaInNAs grown by Molecular-beam Epitaxy for High-current p-i-n solar cell applications." J. of Applied Physics, 98.094501 (2005).

Ptak et al., "Defects in GaInNAs: What We've Learned so Far" National Renewable Energy Laboratory NREL/CP-520-33555, May 2003, 7 pages.

Sabnis et al., A new roadmap for space solar cells, Industry Photovoltaics, www.compoundsemiconductor.net/csc/features-details/19735471, Aug./Sep. 2012, 5 pages.

Saka, T. et al., "Bragg reflector of GaAlAs/AlAs layers with wide bandwidth applicable to light emitting diodes," Journal of Applied Physics, 1993, vol. 73, No. 380, p. 380-383.

Schubert et al., "High-Voltage GaAs Photovoltaic Laser Power Converters", IEEE transactions on Electron Devices, Feb. 2009, vol. 56, No. 2, p. 170-175.

Sin et al., "Carrier Dynamics in MOVPE-Grown Bulk Dilute Nitride Materials for Multi-Junction Solar Cells," Proc. of SPIE, 2011, vol. 7933, 11 pages.

Solar Junction Inc., "Sharp Develops Solar Cell with Word's Highest Conversion Efficiency of 35.8%" Press Release, dated Oct. 22, 2009, 3 pages.

Suarez, F., et al., "Advances in Dilute Nitride Multi-Junction Solar Cells for Space Power Applications", Proceedings of the 11th European Space Power Conference 2016 (ESPC 2016), Published May 23, 2017, 3 pages.

Takeda et al., "Electron mobility and energy gap of In0.53 Ga0.47As on InP substrate," Journal of Applied Physics, Dec. 1976, vol. 47, No. 12, p. 5405-5408.

Tan et al., "Reduction of dark current and unintentional background doping in InGaAsN photodetectors by ex situ annealing," Proc. of SPIE, 2010, vol. 7726, 8 pages.

Tan et al., "Molecular beam epitaxy grown GaNAsSb 1 eV photovoltaic cell," Journal of Crystal Growth, 2011, vol. 335, p. 66-69.

Tan et al., "GaInNAsSb/GaAs Photodiodes for Long-Wavelength Applications," Electron-Device Letters, Jul. 2011, vol. 32, No. 7, p. 919-921.

Tan et al., "Dilute nitride GaInNAs and GaInNAsSb for solar cell applications," Proc. of SPIE, 2012, vol. 8256, 10 pages.

Tan et al., "Improved Optoelectronic Properties of Rapid Thermally Annealed Dilute Nitride GaInNAs Photodetectors," Journal of Electronic Materials, 2012,vol. 41, No. 12, p. 3393-3401.

Tan et al., "High responsivity GaNAsSb p-i-n photodetectors at 1.3um growth by radio-frequency nitrogen plasma-assisted molecular beam epitaxy," Optics Express, May 2008, vol. 16, No. 11, p. 7720-7725.

Tan et al., "Experimental evaluation of impact ionization in dilute nitride GaInNAs diodes," Applied Physics Letters, 2013, vol. 103, p. 102101.

Tobin, S.P. et al., "Enhanced Light Absorption in GaAs Solar Cells with Internal Bragg Reflectors," IEEE Photovoltaic Specialists Conference, Oct. 1991, p. 147-152.

Thomas, Daniel Tomos. "Investigation of material and device properties of GaAsSbN for multi-junction solar cell applications," Jun. 2017, Thesis, Imperial College London, Department of Physics, 25 pages.

Thorlabs. "Longpass Dichroic Mirrors/Beamsplitters", Product Description, Sep. 29, 2008, 15 pages, retrieved from https://www.thorlabs.com/newgrouppage9.cfm?objectgroup_id=3313.

Trotta, R. et al., "Hydrogen diffusion in GaAs1-xNx," The American Physical Society Review, 2009, vol. 80, p. 195206.

(56) References Cited

OTHER PUBLICATIONS

Tukiainen, A. et al., "High-efficiency GaInP/GaAs/GaInNAs solar cells grown by combined MBE-MOCVD technique," Progress in Photovoltaics, Research and Applications, May 2016, vol. 24, p. 914-919.

Tukiainen, A., et al., "Improving the current output of GaInNAs solar cells using distributed Bragg reflectors," IEEE 43rd Photovoltaic Specialists Conference, Jun. 2016, 4 pages.

Unlu, M.S., "Resonant cavity enhanced photonic devices," Journal of Applied Physics Reviews, American Institute of Physics, Jul. 1995, vol. 76, p. 607-632.

Volz et al., Optimization of Annealing Conditions of (GaIn)(NAs) for Solar Cell Applications, pp. 2222-2228, Journal of Crystal Growth 310 (2008).

Volz et al., MOVPE growth of dilute nitride III/V semiconductors using all liquid metalorganic precursors, Journal of Crystal Growth 311 (2009), pp. 2418-2526.

Wicaksono et al., "Effect of growth temperature on defect states of GaAsSbN intrinsic layer in GaAs/GaAsSbN/GaAs photodiode for 1.3 um application," Journal of Applied Physics, 2007, vol. 102, p. 044505.

Wiemer et al., "43.5% Efficient Lattice Matched Solar Cells" Proc. SPIE 810804, High and Low Concentrator Systems for Solar Electric Applications VI (Sep. 19, 2011).

Wistey et al., "Monolithic, GaInNAsSb VCSELs at 1 46um on GaAs by MBE," Electronics Letters, Dec. 2003, vol. 39, No. 25, 2 pages.

Wistey et al., Nitrogen Plasma Optimization for High-Quality Dilute Nitrides, pp. 229-233, Journal of Crystal Growth, available online on Feb. 1, 2005 at http://www.sciencedirect.com.

Wilkins, M., "Multi-junction solar cells and photovoltaic power converters: high-efficiency designs and effects of luminescent coupling," Ph.D. Dissertation, University of Ottawa, Jun. 2017, 152 pages.

Wu et al., Band Anticrossing In Highly Mismatched III-V Semiconductor Alloys, pp. 860-869, Semiconductor Science and Technology 17 (2002).

Xin et al., "Effects of hydrogen on doping of GaInNAs grown by gas-source molecular beam epitaxy," Journal of Vacuum Science and Technology, 2000, vol. 18, p. 1476-1479.

Yamaguchi et al., "Multi-junction III-V solar cells: current status and future potential", in: Solar Energy, vol. 79, issue 1, Jul. 2005.

Yoon, Soon F., et al., "Recent Progress in Dilute Nitride-Antimonide Materials for Photonic and Electronic Applications", ECS Transactions, 2009, XP055524397, pp. 5-29.

Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).

Yuen, "Growth and Characterization of Dilute Nitride Antimonides for Long-Wavelength Optoelectronics," a dissertation submitted to the department of materials science and engineering and the committee on graduate studies of Stanford University in partial fulfillment of the requirements for the degree of doctor of philosophy, Mar. 2006, 203 pages.

Yuen, "The role of antimony on properties of widely varying GaInNAsSb compositions", Journal of Applied Physics, May 2006, vol. 99, p. 093504-1 to 093804-8.

E. Wesoff, "Update: Solar Junction breaking CPV efficiency records, raising $30M", Greentech Media, Apr. 15, 2011, 4 pages.

E. Wesoff, "CPV Roundup: SolFocus funding, 5MW order for Solar Junction, GreenVolts, Amonix", Greentech Media, May 22, 2012, 3 pages.

E. Wesoff, "Record 44 percent CPV efficiency from startup Solar Junction", Greentech Media, Oct. 15, 2012, 3 pages.

Weyers et al., "Red shift of photoluminescence and absorption in dilute GaAsN alloy layers", Japan Journal of Applied Physics, vol. 31, Issue 7A, 1992, p. L853-L855.

International Preliminary Report on Patentability PCT/US2008/008495 dated Jan. 12, 2010, 5 pages.

International Preliminary Report on Patentability for PCT Application No. PCT/US2010/056800, dated May 31, 2012, 6 pages.

International Preliminary Report on Patentability for Application No. PCT/US2015/014650, dated Aug. 9, 2016, 21 pages.

International Search Report and Written Opinion PCT/US2008/008495 dated Apr. 6, 2009, 5 pages.

International Search Report and Written Opinion corresponding to the PCT application No. PCT/US2010/039534, dated Sep. 8, 2010, 8 pages.

International Search Report and Written Opinion corresponding to the PCT application No. PCT/US2010/056800, dated Jan. 26, 2011, 8 pages.

International Search Report and Written Opinion corresponding to the PCT application No. PCT/US2010/061635, dated Mar. 1, 2011, 7 pages.

International Search Report and Written Opinion corresponding to the PCT application No. PCT/US2011/36486, dated Aug. 25, 2011, 12 pages.

International Search Report and Written Opinion of the International Searching Authority for PCT Application No. PCT/US2012/36020, dated Aug. 14, 2012, 11 pages.

International Search Report and Written Opinion of the International Searching Authority for PCT Application No. PCT/US2012/25307, dated Aug. 16, 2012, 13 pages.

International Search Report and Written Opinion for PCT Application No. PCT/US2013/033567, dated Mar. 4, 2014, 12 pages.

International Search Report and Written Opinion corresponding to PCT Application No. PCT/US2015/014650, dated May 20, 2015, 13 pages.

International Search Report and Written Opinion for PCT Application No. PCT/US2016/038567, dated Jun. 21, 2016, 15 pages.

International Search Report and Written Opinion for PCT Application No. PCT/US2018/039544, dated Sep. 10, 2018, 15 pages.

International Search Report and Written Opinion for PCT Application No. PCT/US2018/052873, dated Nov. 22, 2018, 12 pages.

International Search Report and Written Opinion for PCT Application No. PCT/US2019/021598, dated Jun. 14, 2019, 13 pages.

International Search Report and Written Opinion for PCT Application No. PCT/US2019/036857, dated Aug. 23, 2019, 18 pages.

International Search Report and Written Opinion for PCT Application No. PCT/US2019/048533, dated Jan. 2, 2020, 10 pages.

Examination Report for European Application No. 15704681.4, dated Sep. 30, 2019, 7 pages.

Written Opinion for Singapore Application No. 11201606353T, dated Aug. 16, 2017, 6 pages.

Search Report for Singapore Application No. 11201606353T, dated Jun. 22, 2018, 7 pages.

Non-Final Office Action dated Jun. 10, 2010 for U.S. Appl. No. 12/217,818, 15 pages.

Final Office Action dated Jan. 1, 2011 for U.S. Appl. No. 12/217,818, 15 pages.

Non-Final Office Action dated Feb. 13, 2013 for U.S. Appl. No. 12/819,534, 8 pages.

Non-Final Office Action for U.S. Appl. No. 12/819,534, dated Sep. 16, 2015, 10 pages.

Non-Final Office Action dated Oct. 5, 2012 for U.S. Appl. No. 12/944,439, 15 pages.

Final Office Action dated May 29, 2013 for U.S. Appl. No. 12/944,439, 17 pages.

Non-Final Office Action for U.S. Appl. No. 12/944,439, dated Aug. 13, 2014, 11 pages.

Non-Final Office Action dated Oct. 24, 2012 for U.S. Appl. No. 12/749,076, 17 pages.

Non-Final Office Action dated Dec. 14, 2012 for U.S. Appl. No. 13/618,496, 16 pages.

Final Office Action dated Feb. 6, 2013 for U.S. Appl. No. 13/618,496, 8 pages.

Notice of Allowance dated Mar. 22, 2013 for U.S. Appl. No. 13/618,496, 8 pages.

Non-Final Office Action dated May 24, 2013 for U.S. Appl. No. 13/739,989, 7 pages.

(56) References Cited

OTHER PUBLICATIONS

Amendment, Affidavits under 37 C.F.R. §132, and Information Disclosure Statement filed Nov. 2013 for U.S. Appl. No. 13/739,989, 51 pages.
Final Office Action dated Feb. 26, 2014, for U.S. Appl. No. 13/739,989, 16 pages.
Notice of Allowance for U.S. Appl. No. 13/739,989, dated Sep. 30, 2014, 9 pages.
Declaration Under 37 C.F.R. § 1.132 of Homan Yuen filed for U.S. Appl. No. 13/739,989 on Nov. 15, 2013, pp. 1-10.
Declaration Under 37 C.F.R. § 1.132 of Jerry Olson filed for U.S. Appl. No. 13/739,989 on Nov. 15, 2013, pp. 1-5.
Declaration Under 37 C.F.R. § 1.132 of Minjoo Lee filed for U.S. Appl. No. 13/739,989 on Nov. 15, 2013, pp. 1-6.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Non-Final Office Action for U.S. Appl. No. 14/678,737, dated Jul. 6, 2015, 13 pages.
Non-Final Office Action dated Feb. 15, 2013 for U.S. Appl. No. 12/914,710, 14 pages.
Final Office Action dated Sep. 6, 2013 for U.S. Appl. No. 12/914,710, 17 pages.
Notice of Allowance for U.S. Appl. No. 14/914,710, dated Sep. 25, 2015, 13 pages.
Non-Final Office Action dated Dec. 31, 2013, for U.S. Appl. No. 13/370,500, 7 pages.
Notice of Allowance for U.S. Appl. No. 13/370,500, dated Sep. 22, 2014.
Non-Final Office Action dated Nov. 8, 2012 for U.S. Appl. No. 13/104,913, 12 pages.
Notice of Allowance for U.S. Appl. No. 13/104,913, dated Feb. 21, 2014, 8 pages.
Final Office Action dated Oct. 2, 2013 for U.S. Appl. No. 13/104,913, 12 pages.
Non-Final Office Action for U.S. Appl. No. 13/678,389, dated Feb. 20, 2014, 13 pages.
Non-Final Office Action for U.S. Appl. No. 13/678,389, dated Jul. 6, 2015, 11 pages.
Final Office Action for U.S. Appl. No. 13/678,389, dated Oct. 10, 2014, 15 pages.
Non-Final Office Action dated Apr. 15, 2013 for U.S. Appl. No. 13/708,763, 23 pages.
Notice of Allowance for U.S. Appl. No. 13/708,763, dated Feb. 20, 2014, 9 pages.
Non-Final Office Action dated Apr. 25, 2013 for U.S. Appl. No. 13/708,791, 16 pages.
Final Office Action dated Oct. 1, 2013 for U.S. Appl. No. 13/708,791, 15 pages.
Notice of Allowance for U.S. Appl. No. 13/708,791, dated Oct. 31, 2014.
Non-Final Office Action for U.S. Appl. No. 13/894,245, dated Jun. 24, 2015, 19 pages.
Notice of Allowance for U.S. Appl. No. 13/442,146, dated Jul. 7, 2015, 7 pages.
Non-Final Office Action dated Mar. 21, 2014, for U.S. Appl. No. 13/442,146, 6 pages.
Final Office Action for U.S. Appl. No. 14/614,601, dated May 17, 2018, 13 pages.
Non-Final Office Action for U.S. Appl. No. 16/051,109, dated Oct. 30, 2018, 11 pages.
Final Office Action for U.S. Appl. No. 16/051,109, dated Feb. 1, 2019, 11 pages.
Final Office Action dated Sep. 9, 2013 for U.S. Appl. No. 13/819,534, 13 pages.
Non-Final Office Action for U.S. Appl. No. 14/614,601, dated Jan. 23, 2017, 11 pages.
Non-Final Office Action for U.S. Appl. No. 16/018,917, dated Oct. 16, 2018, 12 pages.
Non-Final Office Action for U.S. Appl. No. 16/018,917, dated Sep. 5, 2019, 31 pages.
Final Office Action for U.S. Appl. No. 16/018,917, dated Mar. 22, 2019, 21 pages.
Aho et al., "Temperature Coefficients for GaInP/GaAs/GaInNAsSb Solar Cells," 11th International Conference on Concentrator Photovoltaic Systems, AIP Conference Proceedings, Sep. 2015, vol. 1679, p. 050001-1-5.
Asbeck et al., "Heterojunction bipolar transistors implemented with GaInNAs materials," Semiconductor Science and Technology, vol. 17, No. 8, pp. 898-906, Jul. 2002.
European Search Report for Application No. 10849171.3, dated Aug. 9, 2016, 10 pages.
European Search Report for Application No. 10849171.3, dated Jun. 1, 2017, 8 pages.
European Search Report for Application No. 16194680.1, dated May 29, 2017, 16 pages.
European Search Report for Application No. 20191506.03, dated Oct. 23, 2020, 13 pages.
Final Office Action for U.S. Appl. No. 12/819,534, dated Sep. 9, 2013, 13 pages.
Final Office Action for U.S. Appl. No. 13/894,245, dated May 16, 2018, 14 pages.
Final Office Action for U.S. Appl. No. 13/894,245, dated May 19, 2017, 17 pages.
Final Office Action for U.S. Appl. No. 14/887,021, dated Mar. 9, 2018, 11 pages.
Final Office Action for U.S. Appl. No. 14/887,021, dated Nov. 18, 2016, 22 pages.
Final Office Action for U.S. Appl. No. 14/935,145, dated Apr. 20, 2018, 25 pages.
Final Office Action for U.S. Appl. No. 14/935,145, dated Oct. 25, 2016, 28 pages.
Final Office Action for U.S. Appl. No. 12/819,534, dated Jan. 20, 2016, nine pages.
Final Office Action for U.S. Appl. No. 13/678,389, dated Feb. 4, 2016, fifteen pages.
Final Office Action for U.S. Appl. No. 13/894,245, dated Feb. 5, 2016, twenty five pages.
Final Office Action dated Jun. 5, 2019, for U.S. Appl. No. 16/132,059, filed Sep. 14, 2018, fourteen pages.
Final Office Action dated Nov. 4, 2020, for U.S. Appl. No. 16/103,204, filed Aug. 14, 2018, eighteen pages.
Final Office Action dated Sep. 27, 2019, for U.S. Appl. No. 16/132,059, filed Sep. 14, 2018, twenty four pages.
Green et al., "Solar cell efficiency tables (Version 38)," Progress in Photovoltaics: Research and Applications, 2011, vol. 19, p. 565-572.
Green et al., "Solar cell efficiency tables (Version 39)," Progress in Photovoltaics: Research and Applications, 2012, vol. 20, p. 12-20.
Guter et al., "Current-matched triple-junction solar cell reaching 41.1% conversion efficiency under concentrated sunlight," Applied Physics Letters, Jun. 2009, vol. 94, No. 22, p. 223504.
International Preliminary Report on Patentability for PCT Application No. PCT/US2011/036486, dated Apr. 30, 2013.
International Preliminary Report on Patentability for PCT Application No. PCT/US2017/032712, dated Dec. 6, 2018, 10 pages.
International Search Report and Written Opinion for Application No. PCT/US2017/032712, dated Aug. 2, 2017, 14 pages.
International Search Report and Written Opinion for PCT Application No. PCT/US/2016056437, dated Mar. 20, 2017, 22 pages.
International Search Report and Written Opinion for PCT/US/2036208, dated Sep. 8, 2020, twelve pages.
International Search Report and Written Opinion of the International Searching Authority for PCT Application No. PCT/US12/36020, dated Aug. 14, 2012, 11 pages.
Kirk, Alexander P: "Advancing solar cells to the limit with energy cascading", 2013 IEEE 39th Photovoltaic Specialists Conference (PVSC), IEEE, Jun. 16, 2013 (Jun. 16, 2013), pp. 782-787, XP032568500, DOI: 10.1109/PVSC.2013.6744265, [retrieved on Feb. 18, 2014]* the whole document*.
Non-Final Office Action for U.S. Appl. No. 13/708,763, dated Apr. 15, 2013, 23 pages.

(56) References Cited

OTHER PUBLICATIONS

Non-Final Office Action for U.S. Appl. No. 13/894,245, dated Jan. 8, 2018, 18 pages.
Non-Final Office Action for U.S. Appl. No. 13/894,245, dated Sep. 7, 2016, 33 pages.
Non-Final Office Action for U.S. Appl. No. 14/887,021, dated Jul. 20, 2017, 10 pages.
Non-Final Office Action for U.S. Appl. No. 14/887,021, dated Jun. 15, 2018, 9 pages.
Non-Final Office Action for U.S. Appl. No. 14/935,145, dated Nov. 30, 2018, 7 pages.
Non-Final Office Action for U.S. Appl. No. 14/935,145, dated Sep. 22, 2017, 33 pages.
Non-Final Office Action for U.S. Appl. No. 14/979,899, dated Jul. 1, 2016, 10 pages.
Non-Final Office Action for U.S. Appl. No. 15/391,659, dated Jul. 27, 2017, 6 pages.
Non-Final Office Action for U.S. Appl. No. 15/595,391, dated Mar. 5, 2019, 14 pages.
Non-Final Office Action for U.S. Appl. No. 14/887,021, dated Feb. 18, 2016, 26 pages.
Non-Final Office Action for U.S. Appl. No. 13/678,389, dated Sep. 16, 2016, 21 pages.
Non-Final Office Action for U.S. Appl. No. 14/887,021, dated May 24, 2016., 23 pages.
Non-Final Office Action for U.S. Appl. No. 14/935,145, dated Mar. 17, 2016, 19 pages.
Non-Final Office Action dated Jan. 21, 2021, for U.S. Appl. No. 16/132,059, filed Sep. 14, 2018, twenty nine pages.
Non-Final Office Action dated Oct. 31, 2018, for U.S. Appl. No. 16/132,059, filed Sep. 14, 2018, twenty pages.
Non-Final Office Action dated Dec. 11, 2020, for U.S. Appl. No. 16/521,458, filed Jul. 24, 2019, nine pages.
Non-Final Office Action dated Jun. 5, 2020, for U.S. Appl. No. 16/103,204, filed Aug. 14, 2018, twenty six pages.
Non-Final Office Action dated Mar. 8, 2021, for U.S. Appl. No. 16/103,204, filed Aug. 14, 2018, eighteen pages.

Office Action for European Application No. 18208211.5, dated Mar. 6, 2020, 5 pages.
Office Action for German Application No. 112011103244.7, dated Feb. 20, 2020, 5 pages (translation).
Partial European Search Report for Application No. EP 16194680, dated Feb. 15, 2017, 8 pages.
Ptak et al., "Effects of Bismuth on Wide-Depletion-Width GaInNAs Solar Cells," Journal of Vacuum Science and Technology, 2008, vol. 26, No. 3, p. 1053-1057.
Sabnis et al., "High-Efficiency Multijunction Solar Cells Employing Dilute Nitrides," 8th International Conference on Concentrating Photovoltaic Systems, AIP Conference Proceedings, Oct. 2012, vol. 1477, p. 14-19.
Search Report for European Application No. 18208211, dated Feb. 18, 2019, 7 pages.
Search Report for Singapore Application No. 10201503386S, dated Feb. 16, 2017, six pages.
Search Report for Taiwan Application No. 101116335, dated Dec. 5, 2016, one page.
Search Report for Taiwan Application No. 105133762, dated Jul. 12, 2017, one page.
Takamoto, T. et al., "InGaP/GaAs-based multijunction solar cells," Progress in Photovoltaics: Research and Applications, Sep. 2005, vol. 13, No. 6, p. 495-511.
Chinese Office Action dated Apr. 27, 2021, for CN Application No. 201810666885.7, with English translation, 14 pages.
Final Office Action dated Jul. 26, 2021, for U.S. Appl. No. 16/103,204, filed Aug. 14, 2018, 21 pages.
Final Office Action dated May 14, 2021, for U.S. Appl. No. 16/521,458, filed Jul. 24, 2019, ten pages.
Non-Final Office Action dated Jun. 1, 2021, for U.S. Appl. No. 16/431,521, filed Jun. 4, 2019, ten pages.
Chinese Office Action dated Oct. 21, 2021, for CN Application No. 201810666885.7, with English translation, 15 pages.
European Office Action dated Oct. 22, 2021, for European Application No. 18786911.0, nine pages.
International Preliminary Report on Patentability for PCT/US/2020/036208, dated Dec. 16, 2021, two pages.

\* cited by examiner

SHORT WAVELENGTH INFRARED OPTOELECTRONIC DEVICES HAVING A DILUTE NITRIDE LAYER This application is a continuation under 35 U.S.C. § 111(a) of PCT International Application No. PCT/US2018/052873 filed on Sep. 26, 2018, which claims the benefit under 35 U.S.C. § 119(e) of U.S. Provisional Application No. 62/564,124, filed on Sep. 27, 2017, which is incorporated by reference in its entirety.

FIELD

The disclosure relates to shortwave infrared (SWIR) optoelectronic devices operating within the wavelength range of 0.9 µm to 1.8 µm including photodetectors and photodetector arrays.

BACKGROUND

Optoelectronic devices operating in the infrared wavelength range between 0.9 µm and 1.8 µm range have a wide range of applications, including fiber optic communications, sensing and imaging. Traditionally, compound III-V semiconductor materials are used to make such devices. Indium gallium arsenide (InGaAs) materials are usually grown on indium phosphide (InP) substrates. The composition and thickness of the InGaAs layers are chosen to provide the required functionality, such as light emission or absorption at desired wavelengths of light and are also lattice-matched or very closely lattice-matched to the InP substrate, in order to produce high quality materials that have low levels of crystalline defects, and high levels of performance.

With respect to photodetectors, devices that can be produced include high-speed photodetectors for telecommunications applications, and arrays of photodetectors that can be used as sensors and imagers for military, biomedical, industrial, environmental and scientific applications. In such applications, photodetectors with high responsivity, low dark current and low noise are desirable.

Although InGaAs on InP materials currently dominate the short wavelength infrared (SWIR) photodetector market, the material system has several limitations, including the high cost of InP substrates, low yields due to fragility of the InP substrates, and limited InP wafer diameter (and associated quality issues at larger diameters). From a manufacturing perspective, and also an economic perspective, gallium arsenide (GaAs) represents a better substrate choice. However, the large lattice mismatch between GaAs and the InGaAs alloys required for infrared devices produces poor quality materials that compromise electrical and optical performance. Attempts have been made to produce long-wavelength (greater than 1.2 µm) materials for photodetectors on GaAs based on dilute nitride materials such as GaInNAs and GaInNAsSb. However, where device performance is reported, it has been much poorer than for InGaAs/InP devices, for example, the dilute nitride-based devices have very low responsivity, which make the devices unsuited for practical sensing and photodetection applications. Other considerations for photodetectors include dark current, and specific responsivity.

For example, Cheah et al., "GaAs-Based Heterojunction p-i-n Photodetectors Using Pentenary InGaAsNSb as the Intrinsic Layer", *IEEE Photon. Technol. Letts.*, 17(9), pp. 1932-1934 (2005), and Loke et al., "Improvement of GaInNAs p-i-n photodetector responsivity by antimony incorporation", *J. Appl. Phys.* 101, 033122 (2007) report photodetectors having a responsivity of only 0.097 A/W at a wavelength of 1300 nm.

Tan et al., "GaInNAsSb/GaAs Photodiodes for Long Wavelength Applications, *IEEE Electron. Dev. Letts.*, 32(7), pp. 919-921 (2011) describe photodiodes having a responsivity of only 0.18 A/W at a wavelength of 1300 nm.

In U.S. Application Publication No. 2016/0372624, Yanka et al. disclose optoelectronic detectors having dilute nitride layers (InGaNAsSb). Although certain parameters that relate to semiconductor material quality are described, no working detectors having practical efficiencies are taught within the broad compositional range disclosed.

Thus, to take advantage of the manufacturing scalability and cost advantages of GaAs substrates, there is continued interest in developing long-wavelength materials on GaAs that have improved optoelectronic performance.

SUMMARY

According to the present invention compound semiconductor optoelectronic devices comprise a substrate; a first doped III-V layer overlying the substrate; an active region overlying the first doped III-V region, wherein, the active region comprises a lattice matched or pseudomorphic dilute nitride layer; and the dilute nitride layer has a bandgap within a range from 0.7 eV and 1.0 eV; and a second doped III-V layer overlying the active region.

According to the present invention, methods of forming a semiconductor optoelectronic device comprise forming a substrate; forming a first doped III-V layer overlying the substrate; forming an active region overlying the first doped III-V layer, wherein, the active region comprises a pseudomorphic dilute nitride layer; and the dilute nitride layer has a bandgap within a range from 0.7 eV and 1.0 eV; and forming a second doped III-V layer overlying the active region.

BRIEF DESCRIPTION OF THE DRAWINGS

The drawings described herein are for illustration purposes only. The drawings are not intended to limit the scope of the present disclosure.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

The term "lattice matched" as used herein means that the two referenced materials have the same lattice constant or a lattice constant differing by less than +/−0.2%. For example, GaAs and AlAs are lattice matched, having lattice constants differing by 0.12%.

The term "pseudomorphically strained" as used herein means that layers made of different materials with a lattice constant difference up to +/−2% can be grown on top of a lattice matched or strained layer without generating misfit dislocations. The lattice parameters can differ, for example, by up to +/−1%, by up to +/−0.5%, or by up to +/−0.2%.

The term "layer" as used herein, means a continuous region of a material (e.g., an alloy) that can be uniformly or non-uniformly doped and that can have a uniform or a non-uniform composition across the region.

The term "bandgap" as used herein is the energy difference between the conduction and valence bands of a material.

The term responsivity of a material as used herein is the ratio of the generated photocurrent to the incident light power at a given wavelength.

Figure 1:
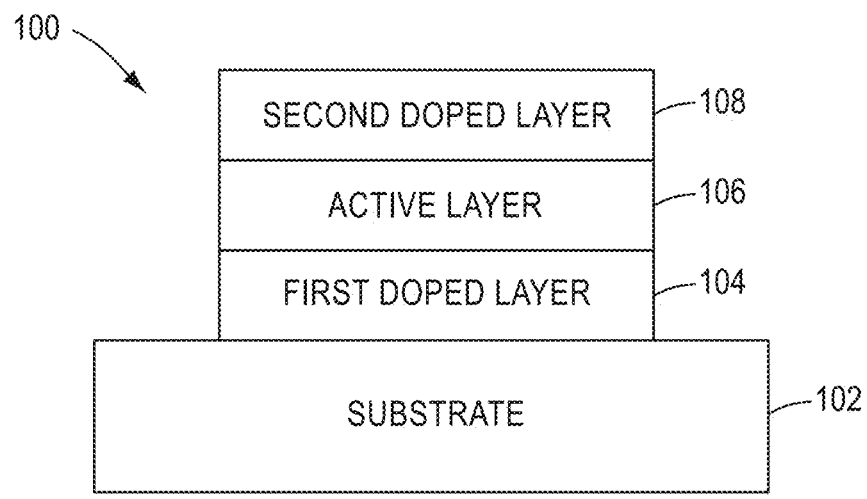
FIG. 1 shows a side view of an example of a semiconductor optoelectronic device according to the present invention.

FIG. 1 shows a side view of an example of a semiconductor optoelectronic device 100 according to the present invention. Device 100 comprises a substrate 102, a first doped layer 104, an active layer 106, and a second doped layer 108. For simplicity, each layer is shown as a single layer. However, it will be understood that each layer can include one or more layers with differing compositions, thicknesses, and doping levels to provide an appropriate optical and/or electrical functionality, and to improve interface quality, electron transport, hole transport and/or other optoelectronic properties.

Substrate 102 can have a lattice constant that matches or nearly matches the lattice constant of GaAs or Ge. The substrate can be GaAs. Substrate 102 may be doped p-type, or n-type, or may be a semi-insulating (SI) substrate. The thickness of substrate 102 can be chosen to be any suitable thickness. Substrate 102 can include one or more layers, for example, the substrate can include a Si layer having an overlying SiGeSn buffer layer, a rare-earth containing layer, or a graded SiGe layer that is engineered to have a lattice constant that matches or nearly matches the lattice constant of GaAs or Ge. A material such as a substrate having a lattice constant that nearly matches the lattice constant of GaAs or Ge means that the material such as the substrate has a lattice constant different than that of GaAs or Ge by less than or equal to 3%, less than 1%, or less than 0.5% of the lattice constant of GaAs or Ge.

First doped layer 104 can have a doping of one type and the second doped layer 108 can have a doping of the opposite type. If first doped layer 104 is doped n-type, second doped layer 108 is doped p-type. Conversely, if first doped layer 104 is doped p-type, second doped layer 108 is doped n-type. Examples of p-type dopants include C and Be. Examples of n-type dopants include Si and Te. Doped layers 104 and 108 are chosen to have a composition that is lattice matched or pseudomorphically strained to the substrate. The doped layers can comprise any suitable III-V material, such as GaAs, AlGaAs, GaInAs, GaInP, GaInPAs, GaInNAs, or GaInNAsSb. The bandgap of the doped layers can be selected to be larger than the bandgap of active layer 106. Doping levels can be within a range, for example, from $1 \times 10^{15}$ cm$^{-3}$ to $2 \times 10^{19}$ cm$^{-3}$. Doping levels may be constant within a layer, and/or the doping profile may be graded, for example, the doping level can increase from a minimum value to a maximum value as a function of the distance from the interface between the first doped layer 104 and the active layer 106. Doped layers 104 and 108 can have a thickness within a range, for example, from 50 nm to 3 µm.

Active layer 106 can be lattice matched or pseudomorphically strained with respect to the substrate and/or to the doped layers. The bandgap of active layer 106 can be lower than that of the doped layers 104 and 108. Active layer 106 comprises a layer capable of processing light over a desired wavelength range. Processing is defined to be a light emission, a light receiving, a light sensing and light modulation.

Active layer 106 can include a dilute nitride material. A dilute nitride material can be $Ga_{1-x}In_xN_yAs_{1-y-z}Sb_z$, where x, y and z can be $0 \le x \le 0.4$, $0 < y \le 0.07$ and $0 < z \le 0.04$, respectively. X, y and z can be $0.01 \le x \le 0.4$, $0.02 \le y \le 0.07$ and $0.001 \le z \le 0.04$, respectively. In other embodiments, dilute nitride materials can have compositions as disclosed in U.S. Pat. No. 8,962,993, where x, y and z can be $0 \le x \le 0.24$, $0.02 \le y \le 0.05$ and $0.001 \le z \le 0.2$, respectively. A dilute nitride material can be $Ga_{1-x}In_xN_yAs_{1-y-z}Sb_z$, where, for example, $0.12 \le x \le 0.24$, $0.03 \le y \le 0.07$ and $0.005 \le z \le 0.04$; $0.13 \le x \le 0.2$, $0.03 \le y \le 0.045$ and $0.001 \le z \le 0.02$; $0.13 \le x \le 0.18$, $0.03 \le y \le 0.04$ and $0.001 \le z \le 0.02$; or $0.18 \le x \le 0.24$, $0.04 \le y \le 0.07$ and $0.01 \le z \le 0.024$. Active layer 106 can have a bandgap within a range from 0.7 eV and 1.1 eV such that the active layer can absorb or emit light at wavelengths up to 1.8 μm. Bismuth (Bi) may be added as a surfactant during growth of the dilute nitride material, improving material quality (such as defect density), and the device performance. The thickness of active layer 106 can be within a range, for example, from 0.2 μm to 10 μm. The thickness of active layer 106 can be within a range, for example, from 0.5 μm to 5 μm. The thickness of active layer 106 can be within a range, for example, from 1 μm to 4 μm, from 1 μm to 3 μm, or from 1 μm to 2 μm. Active layer 106 can be compressively strained with respect to the substrate 102. Strain can improve device performance. For a photodetector, the parameters most relevant to device performance include the dark current, operating speed, noise, and responsivity.

Active layer 106 and doped layers 104 and 108 form a p-i-n or an n-i-p junction. This junction provides the basic structure for operation of a device such as a photodetector or a light-emitting diode. For photodetectors, p-i-n epitaxial structures can have low background doping in the intrinsic region (active layer) of the devices which are typically operated at 0 V or very low bias. Therefore, the active layer 106 may not be deliberately doped. The active layer can be an intrinsic layer or an unintentionally doped layer. Unintentionally doped semiconductors do not have dopants intentionally added but can include a nonzero concentration of impurities that act as dopants. The background carrier concentration of the intrinsic or unintentionally doped active layer, which is equivalent to the dopant concentration, can be, for example, less than $1 \times 10^{16}$ cm$^{-3}$ (measured at room temperature (25° C.), less than $5 \times 10^{15}$ cm$^{-3}$, or less than $1 \times 10^{15}$ cm$^{-3}$. The minority carrier lifetime within the active layer can be, for example, greater than 1 ns, greater than 1.5 ns, or greater 2 ns. The minority carrier lifetime can be affected by defects within the semiconductor that contribute to the background carrier concentration, as well as other defect types that can act as recombination centers but do not contribute carriers.

Figure 2:
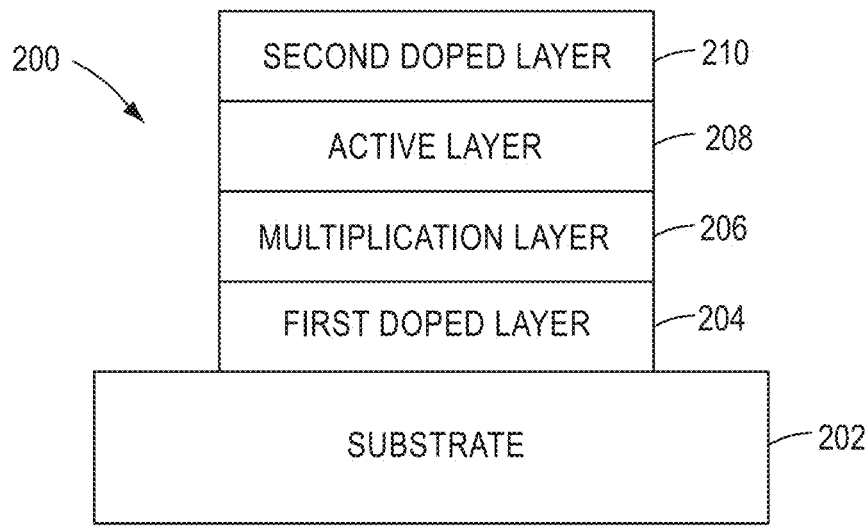
FIG. 2 shows a side view of another example of a semiconductor optoelectronic device according to the present invention.

FIG. 2 shows a semiconductor optoelectronic device 200 with a p-i-n diode and a multiplication layer. Device 200 is similar to device 100, but also includes a multiplication layer. The purpose of the multiplication layer is to amplify the photocurrent generated by the active region of a photodetector device. The structure of device 200 can provide an avalanche photodiode (APD). An APD introduces an additional p-n junction into the structure, as well as introduces an additional thickness. This allows a higher reverse bias voltage to be applied to the device, which results in carrier multiplication by the avalanche process.

Substrate 202 can have a lattice constant that matches or nearly matches the lattice constant of GaAs or Ge. The substrate can be GaAs. Substrate 202 may be doped p-type, or n-type, or may be a semi-insulating (SI) substrate. The thickness of substrate 202 can be chosen to be any suitable thickness. Substrate 202 can include one or more layers, for example, a Si layer having an overlying SiGeSn buffer layer that is engineered to have a lattice constant that matches or nearly matches the lattice constant of GaAs or Ge. This can mean the substrate has a lattice parameter different than that of GaAs or Ge by less than or equal to 3%, less than 1%, or less than 0.5% that of GaAs or Ge.

First doped layer 204 can have a doping of one type and the second doped layer 210 can have a doping of the opposite type. If first doped layer 204 is doped n-type, second doped layer 210 is doped p-type. Conversely, if first doped layer 204 is doped p-type, second doped layer 210 is doped n-type. Examples of p-type dopants include C and Be. Examples of n-type dopants include Si and Te. Doped layers 204 and 210 can be chosen to have a composition that is lattice matched or pseudomorphically strained to the substrate. The doped layers can comprise any suitable III-V material, such as GaAs, AlGaAs, GaInAs, GaInP, GaInPAs, GaInNAs, GaInNAsSb. The bandgap of the doped layers can be selected to be larger than the bandgap of active layer 208. Doping levels can be within a range, for example, from $1 \times 10^{15}$ cm$^{-3}$ to $2 \times 10^{19}$ cm$^{-3}$. Doping levels may be constant within a layer and/or the doping profile may be graded, for example, the doping level can increase from a minimum value to a maximum value as a function of the distance from the interface between the second doped layer 210 and the active layer 208. Doped layers 204 and 210 can have a thickness, for example, within a range from 50 nm and 3 μm.

Active layer 208 can be lattice matched or pseudomorphically strained to the substrate and/or to the doped layers. The bandgap of active layer 208 can be lower than that of the doped layers 204 and 210. Active layer 208 can comprise a layer capable of processing light over a desired wavelength range. Processing is defined to be a light emission, a light receiving, a light sensing and light modulation.

Active layer 208 can include a dilute nitride material. The dilute nitride material can be $Ga_{1-x}In_xN_yAs_{1-y-z}Sb_z$, where x, y and z can be 0≤x≤0.4, 0<y≤0.07 and 0<z≤0.04, respectively. X, y and z can be 0.01≤x≤0.4, 0.02≤y≤0.07 and 0.001≤z≤0.04, respectively. In other embodiments, dilute nitride materials can have compositions as disclosed in U.S. Pat. No. 8,962,993, where x, y and z can be 0≤x≤0.24, 0.02≤y≤0.05 and 0.001≤z≤0.2, respectively. A dilute nitride material can be $Ga_{1-x}In_xN_yAs_{1-y-z}Sb_z$, where, for example, 0.12≤x≤0.24, 0.03≤y≤0.07 and 0.005≤z≤0.04; 0.13≤x≤0.20, 0.03≤y≤0.045 and 0.001≤z≤0.02; 0.13≤x≤0.18, 0.03≤y≤0.04 and 0.001≤z≤0.02; or 0.18≤x≤0.24, 0.04≤y≤0.07 and 0.01≤z≤0.04. Active layer 208 can have a bandgap within a range from 0.7 eV to 1.1 eV such that the active layer can absorb or emit light at wavelengths up to 1.8 μm. Bismuth (Bi) may be added as a surfactant during growth of the dilute nitride, improving material quality (such as defect density), and the device performance. The thickness of active layer 208 can be within a range, for example, from 0.2 μm to 10 μm, from 0.5 μm to 5 μm, or from 1 μm to 4 μm. Active layer 208 can be compressively strained with respect to the substrate 202. Strain can also improve device performance. For a photodetector, the device performance of most relevance includes the dark current, operating speed, noise and responsivity.

The multiplication layer 206 can be a p-type III-V layer configured to amplify the current generated by the active layer 208 through avalanche multiplication. Thus, for each free carrier (electron or hole) generated by the active layer 208, the multiplication layer 206 generates one or more carriers via the avalanche effect. Thus, the multiplication layer 206 increases the total current generated by the semiconductor 200. Multiplication layer 206 can comprise a III-V material, such as GaAs or AlGaAs.

Figure 3:
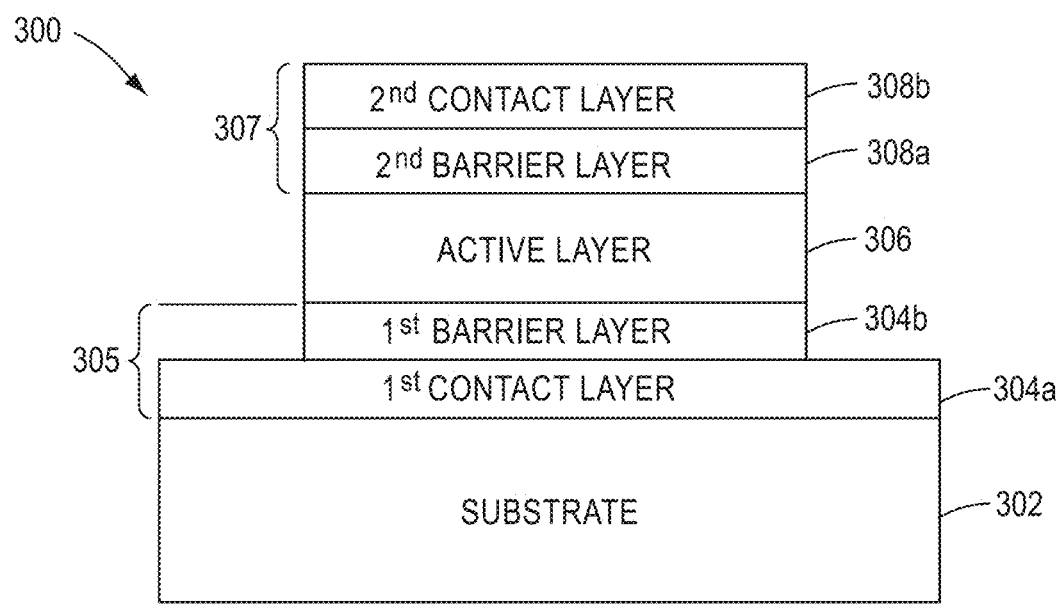
FIG. 3 shows a side view of another example of a semiconductor optoelectronic device according to the present invention.

FIG. 3 shows a side view of an example of a semiconductor optoelectronic device 300 according to the present invention. Device 300 is similar to device 100, but each of the doped layers are shown to comprise two layers. Device 300 includes a substrate 302, a first contact layer 304a, a first barrier layer 304b, an active layer 306, a second barrier layer 308a, and a second contact layer 308b.

Substrate 302 can have a lattice constant that matches or nearly matches the lattice constant of GaAs or Ge. The substrate can be GaAs. Substrate 302 may be doped p-type, or n-type, or may be a semi-insulating (SI substrate). The thickness of substrate 302 can be any suitable thickness.

Substrate 302 can include one or more layers, for example, substrate 302 can include a Si layer having an overlying SiGeSn buffer layer that is engineered to have a lattice constant that matches or nearly matches the lattice constant of GaAs or Ge. This can mean that the substrate can have a lattice parameter different than that of GaAs or Ge by less than or equal to 3%, less than 1%, or less than 0.5% that of GaAs or Ge.

First contact layer 304a and first barrier layer 304b provide a first doped layer 305, having a doping of one type, and second barrier layer 308a and second contact layer 308b provide a second doped layer 307, having a doping of the opposite type. If first doped layer 305 is doped n-type, second doped layer 307 is doped p-type. Conversely, if first doped layer 305 is doped p-type, second doped layer 307 is doped n-type. Examples of p-type dopants include C and Be. Examples of n-type dopants include Si and Te. Doped layers 305 and 307 can be chosen to have a composition that is lattice matched or pseudomorphically strained with respect to the substrate. The doped layers can comprise any suitable III-V material, such as GaAs, AlGaAs, GaInAs, GaInP, GaInPAs, GaInNAs, GaInNAsSb. The contact and barrier layers can have different compositions and different thicknesses. The bandgap of the doped layers can be selected to be larger than the bandgap of active region 306. The doping level of first contact layer 304a can be chosen to be higher than the doping level of first barrier layer 304b. A higher doping facilitates electrical connection with a metal contact. Similarly, the doping level of second contact layer 304b can be chosen to be higher than the doping level of second barrier layer 304a. Higher doping levels facilitate electrical connection with a metal contact. Doping levels can be within a range, for example, from $1\times10^{15}$ cm$^{-3}$ to $2\times10^{19}$ cm$^{-3}$. Doping levels may be constant within a layer and/or the doping profile may be graded, for example, the doping level can increase from a minimum value to a maximum value as a function of the distance from the interface between the doped layer 308a and the active layer 306. Each of barrier and contact layers 304a, 304b, 308a and 308b can have a thickness, for example, within a range from 50 nm to 3 μm.

Active layer 306 can be lattice matched or pseudomorphically strained to the substrate and/or to the barrier layers. The bandgap of active layer 306 can be lower than that of barrier and contact layers 304a, 304b, 308a and 308b. Active layer 306 can comprise a layer capable of processing light over a desired wavelength range. Processing is defined to be a light emission, a light receiving, a light sensing and light modulation.

Active layer 306 can include a dilute nitride material. The dilute nitride material can be $Ga_{1-x}In_xN_yAs_{1-y-z}Sb_z$, where x, y and z can be $0 \leq x \leq 0.4$, $0 < y \leq 0.07$ and $0 < z \leq 0.04$, respectively. X, y and z can be $0.01 \leq x \leq 0.4$, $0.02 \leq y \leq 0.07$ and $0.001 \leq z \leq 0.04$, respectively. In other embodiments, dilute nitride materials can have compositions as disclosed in U.S. Pat. No. 8,962,993, where x, y and z can be $0 \leq x \leq 0.24$, $0.02 \leq y \leq 0.05$ and $0.001 \leq z \leq 0.2$, respectively. A dilute nitride material can be $Ga_{1-x}In_xN_yAs_{1-y-z}Sb_z$, where, for example, $0.12 \leq x \leq 0.24$, $0.03 \leq y \leq 0.07$ and $0.005 \leq z \leq 0.04$; $0.13 \leq x \leq 0.2$, $0.03 \leq y \leq 0.045$ and $0.001 \leq z \leq 0.02$; $0.13 \leq x \leq 0.18$, $0.03 \leq y \leq 0.04$ and $0.001 \leq z \leq 0.02$; or $0.18 \leq x \leq 0.24$, $0.04 \leq y \leq 0.07$ and $0.01 \leq z \leq 0.04$. Active layer 306 can have a bandgap within a range from 0.7 eV to 1.0 eV such that the active layer can absorb or emit light at wavelengths up to 1.8 μm. Bismuth (Bi) may be added as a surfactant during growth of the dilute nitride, improving material quality (such as defect density), and the device performance. The thickness of active layer 306 can be, for example, within a range from 0.2 μm to 10 μm or from 1 μm to 4 μm. The carrier concentration of the active layer can be, for example, less than $1\times10^{16}$ cm$^{-3}$ (measured at room temperature (25° C.)), less than $5\times10^{15}$ cm$^{-3}$, or less than $1\times10^{15}$ cm$^{-3}$. Active layer 306 can be compressively strained with respect to the substrate 302. Strain can also improve device performance. For a photodetector, the parameters most relevant to device performance include the dark current, operating speed, noise and responsivity.

Figure 4:
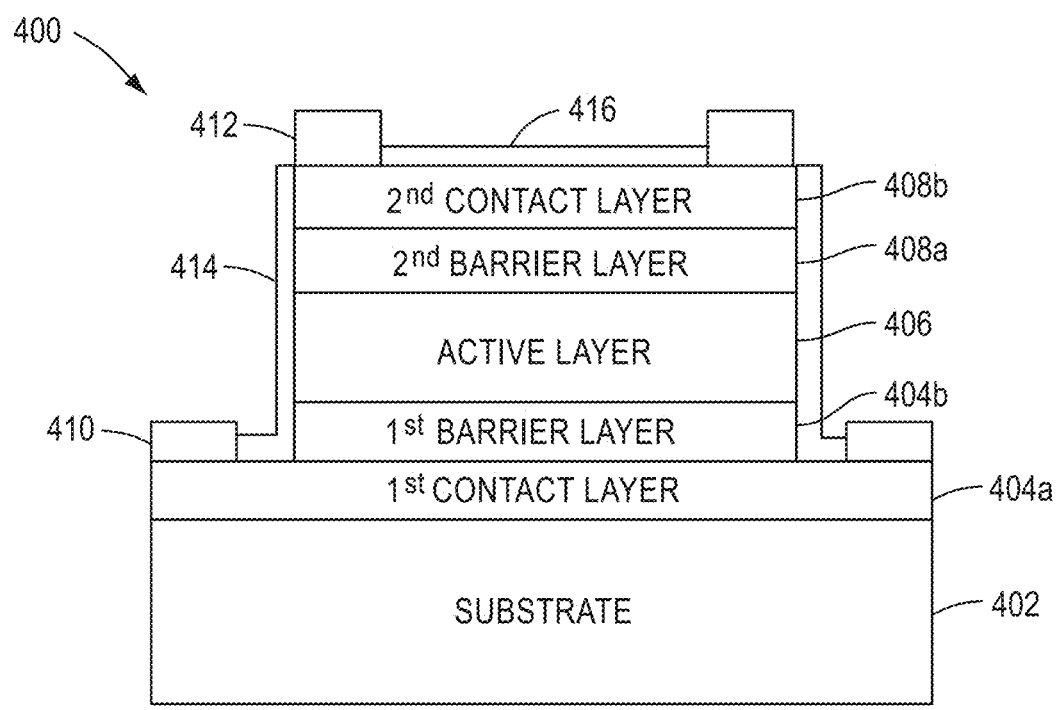
FIG. 4 shows a side view of an example of a photodetector according to the present invention.

FIG. 4. Shows a side view of an example of a photodetector 400 according to the present invention. Device 400 is similar to device 300. Compared to device 300, additional device layers include a first metal contact 410, a second metal contact 412, a passivation layer 414, and an antireflection coating 416. The semiconductor layers 402, 404a, 404b, 406, 408a and 408b correspond to layers 302, 304a, 304b, 306, 308a and 308b, respectively, of device 300. Multiple lithography and materials deposition steps may be used to form the metal contacts, passivation layer, and antireflection coating. The device has a mesa structure, produced by etching. This exposes the underlying layers. A passivation layer 414 is provided that covers the side-walls of the device and the exposed surfaces of layers so as to reduce surface defects and dangling bonds that may otherwise affect device performance. The passivation layer can be formed using a dielectric material such as silicon nitride, silicon oxide, or titanium oxide. Anti-reflection layer 416 overlies a first portion of second contact layer 408a. The antireflection layer can be formed using a dielectric material such as silicon nitride, silicon oxide, and titanium oxide. A first metal contact 410 overlies a portion of the first contact layer 404a. A second metal contact 412 overlies a second portion of second contact layer 408b. Metallization schemes for contacting to n-doped and p-doped materials are known to those ordinarily skilled in the art. Photodetector 400 can be illuminated from the top surface of the device, i.e. through the interface between anti-reflection coating 416 and air. A photodetector may be illuminated via the bottom surface, i.e. the interface between the lower surface of the substrate 402 and air. The bottom surface of the substrate may be coated with an anti-reflection coating. Incident optical radiation on a detector will generate an electronic signal at the detector.

Figure 5A:
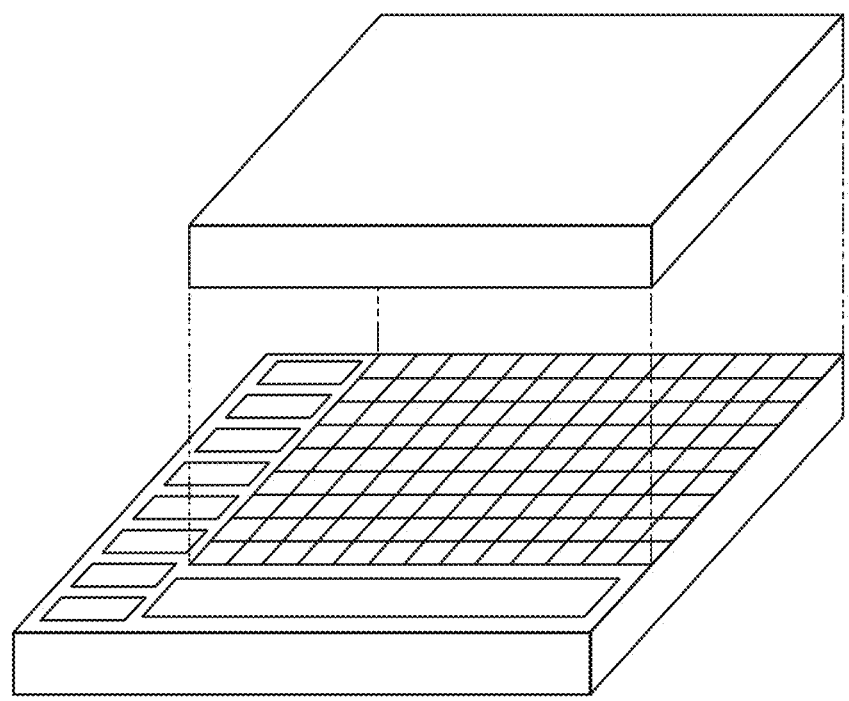
FIGS. 5A and 5B are diagrams showing hybrid integration of a detector array chip with an array of readout circuits on a readout integrated circuit (ROIC) chip
Figure 5B:
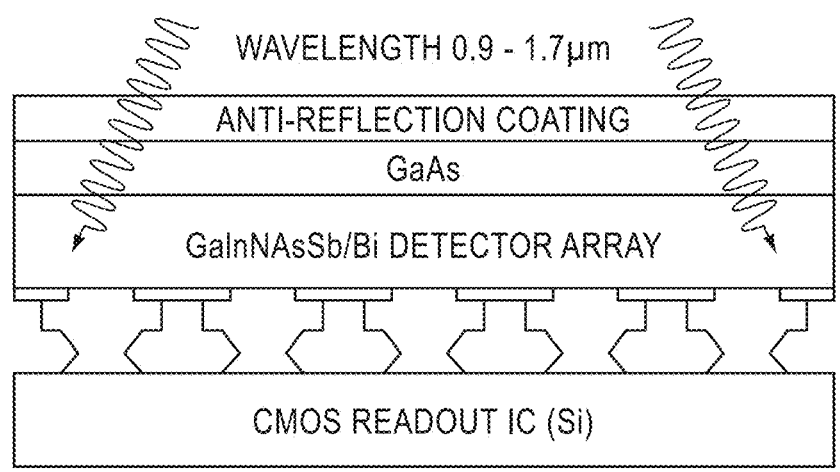

For an array of detectors, the collected signals may be amplified by a readout integrated circuit (ROIC) comprising a transistor or a trans-impedance amplifier to form a Focal Plane Array (FPA). Examples of photodetector arrays are shown in FIGS. 5A and 5B.

To fabricate optoelectronic devices provided by the present disclosure, a plurality of layers is deposited on a substrate in a materials deposition chamber. The plurality of layers may include active layers, doped layers, contact layers, etch stop layers, release layers (i.e., layers designed to release the semiconductor layers from the substrate when a specific process sequence, such as chemical etching, is applied), buffer layers, or other semiconductor layers.

The plurality of layers can be deposited, for example, by molecular beam epitaxy (MBE) or by metal-organic chemical vapor deposition (MOCVD). Combinations of deposition methods may also be used.

A semiconductor optoelectronic device can be subjected to one or more thermal annealing treatments after growth. For example, a thermal annealing treatment can include the application of a temperature of 400° C. to 1000° C. for from 10 seconds to 10 hours. Thermal annealing may be performed in an atmosphere that includes air, nitrogen, arsenic, arsine, phosphorus, phosphine, hydrogen, forming gas, oxygen, helium and any combination of the preceding materials.

Devices provided by the present disclosure can comprise a GaInNAsSb active region overlying a GaAs substrate. The GaInNAsSb layer can be compressively strained with respect to the GaAs substrate. For example, the XRD peak slitting between the GaInNAsSb peak and the GaAs substrate peak can be, for example, from 600 arcsec to 1,000 arcsec, from 600 arcsec to 800 arcsec, or from 650 arcsec to 750 arcsec. An XRD splitting corresponds to a compressive strain from 0.2% to 0.35%.

A dilute nitride layer such as a GaInNAsSb layer can have an intrinsic or unintentional doping equivalent to a doping concentration, for example, less than $1\times10^{16}$ cm$^{-3}$, less than $5\times10^{15}$ cm$^{-3}$, or less than $1\times10^{15}$ cm$^{-3}$, measured at room temperature (25° C.). A dilute nitride layer such as a GaInNAsSb layer can have an intrinsic or unintentional doping equivalent to a doping concentration, for example, from $0.5\times10^{14}$ cm$^{-3}$ to $1\times10^{16}$ cm$^{-3}$ or from $1\times10^{15}$ cm$^{-3}$ to $5\times10^{15}$ cm$^{-3}$, measured at room temperature (25° C.).

A dilute nitride layer such as a GaInNAsSb layer can have a minority carrier lifetime, for example, from 1.0 ns to 3.0 ns, from 1.5 ns to 2.5 ns, or from 1.5 ns to 2.0 ns. A dilute nitride layer such as a GaInNAsSb layer can have a minority carrier lifetime, for example, greater than 1.0 ns, greater than 1.5 ns, greater than 2.0 ns, or greater than 2.5 ns. The TRPL kinetics are measured at room temperature (25° C.) at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

A dilute nitride layer such as a GaInNAsSb layer can have a bandgap, for example, from 0.9 eV to 0.92 eV.

A dilute nitride layer such as a GaInNAsSb layer can have a full width half maximum, for example, from 50 nm to 150 nm, from 50 nm to 125 nm, from 50 nm to 70 nm, or from 75 nm to 125 nm, as determined by photoluminescence.

The dilute nitride layer such as a GaInNAsSb layer can have a thickness, for example, from 0.25 μm to 2.5 μm, from 0.5 μm to 2.0 μm, or from 0.5 μm to 1.5 μm.

A device, such as a photodetector, can have the structure of FIG. 4.

A device such as a photodetector can have a diameter, for example, from 20 μm to 3 mm, from 0.5 mm to 2.5 mm, or from 1 mm to 2 mm. A device such as a photodetector can have a diameter, for example, greater than 20 μm, greater than 100 μm, greater than 500 μm, greater than 1 mm, or greater than 2 mm.

A device such as a photodetector can have sidewall angles between about 70° and 90° (perpendicular to the substrate) such as between about 80° and 90°.

A device such as a photodetector can have a responsivity within a range, for example, from 0.55 A/W to 0.90 A/W, 0.6 A/W to 0.85 A/W, from 0.65 A/W to 0.80 A/W at a wavelength of 1300 nm, where responsivity was measured using a broad-band halogen lamp, with light monochromatized with 10 nm wavelength band.

A device such as a photodetector can have a diameter from 0.75 mm to 1.25 mm such as from 0.9 mm to 1.1 mm can exhibit a dark current, for example, from 2.5 nA to 4.5 nA, from 2.7 nA to 4.3 nA, from 2.9 nA to 4.1 nA, from 3.1 nA to 3.9 nA, or from 3.2 nA to 3.8 nA, at a bias voltage of 1V, measured at room temperature (25° C.).

A photodetector having a dilute nitride active layer can have the structure shown in FIG. 4. The substrate can be a semi-insulating GaAs substrate, the first barrier layer can be a p-doped GaAs layer having a thickness from 0.05 μm to 0.15 μm and a doping level from $1\times10^{17}$ cm$^{-3}$ to $1\times10^{19}$ cm$^{-3}$, the second barrier layer can be an n-doped GaAs layer having a thickness from 0.05 um to 0.15 um and a doping level from $1\times10^{17}$ cm$^{-3}$ to $1\times10^{19}$ cm$^{-3}$, and the active layer can be a GaInNAsSb layer having a bandgap from 0.9 eV to 0.92 eV, a FWHM from 50 nm to 70 nm, and a thickness from 0.05 μm to 0.15 μm. The XRD splitting between the GaInNAsSb peak ant the GaAs substrate can be from 600 arcsec to 1000 arcsec corresponding to a compressive strain of 0.2% to 0.35%.

The photodetector can have a diameter having the structure of FIG. 4 can have a diameter from 0.75 mm to 1.25 mm, sidewall angles from 70° and 90° (perpendicular to the substrate), a responsivity within a range from 0.6 A/W to 0.85 A/W (at a wavelength of 1300 nm) measured using a broad-band halogen lamp, with light monochromatized with 10 nm wavelength band, and a dark current from 2.5 nA to 4.5 nA. at a bias voltage of 1V, measured at room temperature (25° C.).

Aspects of the Invention

Aspect 1. A compound semiconductor optoelectronic device, comprising: a substrate; a first doped III-V layer overlying the substrate; an active region overlying the first doped III-V region, wherein, the active region comprises a lattice matched dilute nitride layer or a pseudomorphic dilute nitride layer; the dilute nitride layer has a bandgap within a range from 0.7 eV and 1.0 eV; and the dilute nitride layer has a minority carrier lifetime of 1 ns or greater. The minority carrier lifetime is measured at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm; and a second doped III-V layer overlying the active region.

Aspect 2. The device of aspect 1, wherein the dilute nitride layer has a compressive strain within a range from 0% and 0.4% with respect to the substrate. The compressive strain is determined using X-ray diffraction.

Aspect 3. The device of any one of aspects 1 to 2, wherein the dilute nitride layer has a minority carrier lifetime of the active layer is 2 ns or greater. The minority carrier lifetime is measured at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

Aspect 4. The device of any one of aspects 1 to 3, wherein the substrate comprises GaAs, AlGaAs, Ge, SiGeSn, or buffered Si.

Aspect 5. The device of any one of aspects 1 to 4, wherein the dilute nitride layer has a lattice constant less than 3% the lattice constant of GaAs or Ge.

Aspect 6. The device of any one of aspects 1 to 5, wherein the dilute nitride layer comprises GaInNAs, GaNAsSb, GaInNAsSb, GaInNAsBi, GaNAsSbBi, GaNAsBi or GaInNAsSbBi.

Aspect 7. The device of any one of aspects 1 to 6, wherein the dilute nitride layer comprises $Ga_{1-x}In_xN_yAs_{1-y-z}Sb_z$, wherein $0 \leq x \leq 0.4$, $0 \leq y \leq 0.07$, and $0 \leq z \leq 0.04$.

Aspect 7A. The device of any one of aspects 1 to 6, wherein the dilute nitride layer comprises $Ga_{1-x}In_xN_yAs_{1-y-z}Sb_z$, wherein $0 \leq x \leq 0.24$, $0.02 \leq y \leq 0.05$ and $0.001 \leq z \leq 0.2$, respectively.

Aspect 7B. The device of any one of aspects 1 to 6, wherein the dilute nitride layer comprises $Ga_{1-x}In_xN_yAs_{1-y-z}Sb_z$, wherein $0.12 \leq x \leq 0.24$, $0.03 \leq y \leq 0.07$ and $0.005 \leq z \leq 0.04$, respectively.

Aspect 7C. The device of any one of aspects 1 to 6, wherein the dilute nitride layer comprises $Ga_{1-x}In_xN_yAs_{1-y-z}Sb_z$, wherein $0.13 \leq x \leq 0.2$, $0.03 \leq y \leq 0.045$ and $0.001 \leq z \leq 0.02$, respectively.

Aspect 7D. The device of any one of aspects 1 to 6, wherein the dilute nitride layer comprises $Ga_{1-x}In_xN_yAs_{1-y-z}Sb_z$, wherein $0.13 \leq x \leq 0.18$, $0.03 \leq y \leq 0.04$ and $0.001 \leq z \leq 0.02$, respectively.

Aspect 7E. The device of any one of aspects 1 to 6, wherein the dilute nitride layer comprises $Ga_{1-x}In_xN_yAs_{1-y-z}Sb_z$, wherein $0.18 \leq x \leq 0.24$, $0.04 \leq y \leq 0.07$ and $0.01 \leq z \leq 0.04$, respectively.

Aspect 8. The device of any one of aspects 1 to 7E, wherein the dilute nitride layer has a thickness within a range from 0.2 μm to 10 μm.

Aspect 9. The device of any one of aspects 1 to 8, wherein the device comprises a photodetector.

Aspect 10. The device of aspect 9, wherein the photodetector has a responsivity greater than 0.6 A/W at 1300 nm. The responsivity is measured using a broad-band halogen lamp, with light monochromatized with 10 nm wavelength band.

Aspect 11. The device of aspect 9, wherein the photodetector has a responsivity greater than 0.8 A/W at 1300 nm. The responsivity is measured using a broad-band halogen lamp, with light monochromatized with 10 nm wavelength band.

Aspect 12. The device of any one of aspects 1 to 11, wherein the device comprises a light emitting diode.

Aspect 13. A method of forming a semiconductor optoelectronic device, comprising: forming a substrate; forming a first doped III-V layer overlying the substrate; forming an active region overlying the first doped III-V layer, wherein, the active region comprises a pseudomorphic dilute nitride layer; the dilute nitride layer has a bandgap within a range from 0.7 eV and 1.0 eV; and the dilute nitride layer has a minority carrier lifetime of 1 ns or greater. The minority carrier lifetime is measured at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm; and forming a second doped III-V layer overlying the active region.

Aspect 14. The method of aspect 13, wherein the dilute nitride layer comprises GaInNAs, GaNAsSb, GaInNAsSb, GaInNAsBi, GaNAsSbBi, GaNAsBi or GaInNAsSbBi.

Aspect 15. The method of any one of aspects 13 to 14, wherein the dilute nitride layer comprises $Ga_{1-x}In_xN_yAs_{1-y-z}Sb_z$, wherein $0 \leq x \leq 0.4$, $0 \leq y \leq 0.07$, and $0 \leq z \leq 0.04$.

Aspect 15A. The device of any one of aspects 13 to 14, wherein the dilute nitride layer comprises $Ga_{1-x}In_xN_yAs_{1-y-z}Sb_z$, wherein $0 \leq x \leq 0.24$, $0.02 \leq y \leq 0.05$ and $0.001 \leq z \leq 0.2$, respectively.

Aspect 15B. The device of any one of aspects 13 to 14, wherein the dilute nitride layer comprises $Ga_{1-x}In_xN_yAs_{1-y-z}Sb_z$, wherein $0.12 \leq x \leq 0.24$, $0.03 \leq y \leq 0.07$ and $0.005 \leq z \leq 0.04$, respectively.

Aspect 15C. The device of any one of aspects 13 to 14, wherein the dilute nitride layer comprises $Ga_{1-x}In_xN_yAs_{1-y-z}Sb_z$, wherein $0.13 \leq x \leq 0.20$, $0.03 \leq y \leq 0.045$ and $0.001 \leq z \leq 0.02$, respectively.

Aspect 15D. The device of any one of aspects 13 to 14, wherein the dilute nitride layer comprises $Ga_{1-x}In_xN_yAs_{1-y-z}Sb_z$, wherein $0.13 \leq x \leq 0.18$, $0.03 \leq y \leq 0.04$ and $0.001 \leq z \leq 0.02$, respectively.

Aspect 15E. The device of any one of aspects 13 to 14, wherein the dilute nitride layer comprises $Ga_{1-x}In_xN_yAs_{1-y-z}Sb_z$, wherein $0.18 \leq x \leq 0.24$, $0.04 \leq y \leq 0.07$ and $0.01 \leq z \leq 0.04$, respectively.

Aspect 16. The method of any one of aspects 13 to 15E, wherein the dilute nitride layer has a thickness within a range from 0.2 μm and 10 μm.

Aspect 17. The method of any one of aspects 13 to 16, wherein the substrate comprises GaAs, AlGaAs, Ge, SiGeSn, or buffered Si.

Aspect 18. The method of any one of aspects 13 to 17, wherein the dilute nitride layer has a lattice constant less than 3% the lattice constant of GaAs or Ge.

Aspect 19. The method of any one of aspects 13 to 18, wherein the dilute nitride layer has compressive strain within a range from 0% and 0.4% with respect to the substrate. The compressive strain is determined using X-ray diffraction.

Aspect 20. The method of any one of aspects 13 to 19, wherein the device comprises a photodetector.

Aspect 21. The method of aspect 20, wherein the photodetector has a responsivity greater than 0.6 A/W at 1300 nm, wherein responsivity was measured using a broad-band halogen lamp, with light monochromatized with 10 nm wavelength band.

Aspect 22. The method of aspect 20, wherein the photodetector has a responsivity greater than 0.8 A/W at 1300 nm, wherein responsivity was measured using a broad-band halogen lamp, with light monochromatized with 10 nm wavelength band.

Aspect 23. The device of any one of aspects 1 to 12, wherein a sidewall angle of the photodetector is between 70 degrees and 90 degrees.

Aspect 24. The device of any one of aspects 1 to 12, wherein the substrate is GaAs and the dilute nitride layer is a GaInNAsSb layer.

Aspect 25. The device of aspect 24, wherein the GaInNAsSb layer has a XRD peak slitting between the GaInNAsSb peak and the GaAs substrate peak can be, for example, from 600 arcsec to 1,000 arcsec, from 600 arcsec to 800 arc sec, or from 650 arcsec to 750 arcsec.

Aspect 26. The device of any one of aspects 24 to 25, wherein the GaInNAsSb layer has a compressive strain from 0.2% to 0.35% with respect to the GaAs substrate.

Aspect 27. The device of any one of aspects 24 to 26, wherein the GaInNAsSb layer can have an intrinsic or unintentional doping equivalent to a doping concentration less than $5 \times 10^{15}$ $cm^{-3}$, measured at room temperature (25° C.).

Aspect 28. The device of any one of aspects 24 to 27, wherein the GaInNAsSb layer has an intrinsic or unintentional doping equivalent to a doping concentration from $0.5 \times 10^{14}$ $cm^{-3}$ to $1 \times 10^{16}$ $cm^{-3}$, measured at room temperature (25° C.).

Aspect 29. The device of any one of aspects 24 to 28, wherein the GaInNAsSb layer has a minority carrier lifetime from 1.0 ns to 3.0 ns. The minority carrier lifetime is measured at room temperature (25° C.) at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

Aspect 30. The device of any one of aspects 24 to 28, wherein the GaInNAsSb layer has a minority carrier lifetime greater than 1.0 ns. The minority carrier lifetime is measured at room temperature (25° C.) at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

Aspect 31. The device of any one of aspects 24 to 30, wherein the GaInNAsSb layer has a bandgap, for example, from 0.9 eV to 0.92 eV.

Aspect 32. The device of any one of aspects 24 to 31, wherein the GaInNAsSb layer has a full width half maximum from 50 nm to 150 nm. The full width half maximum is determined by photoluminescence.

Aspect 33. The device of any one of aspects 24 to 32, wherein the GaInNAsSb layer can has a thickness from 0.25 µm to 2.5 µm.

Aspect 34. The device of any one of aspects 24 to 33, wherein the device has a diameter from 20 µm to 3 mm.

Aspect 35. The device of any one of aspects 24 to 33, wherein the device has a diameter from 0.5 mm to 2.5 mm.

Aspect 36. The device of any one of aspects 24 to 34, wherein the device has sidewall angles between 70° and 90° perpendicular to the substrate.

Aspect 37. The device of any one of aspects 24 to 35, wherein the device has a responsivity within a range, for example, from 0.55 A/W to 0.90 A/W at a wavelength of 1300 nm. The responsivity is measured using a broad-band halogen lamp, with light monochromatized with 10 nm wavelength band.

Aspect 38. The device of any one of aspects 24 to 37, wherein the device has a diameter from 0.75 mm to 1.25 mm and a dark current from 2.5 nA to 4.5 nA at a bias voltage of 1V, measured at room temperature (25° C.).

Aspect 39. The device of any one of aspects 24 to 38, wherein the device has a diameter from 0.75 mm to 1.25 mm and a dark current from 3.2 nA to 3.8 nA at a bias voltage of 1V, measured at room temperature (25° C.).

Aspect 40. The device of any one of aspects 24 to 39, wherein the device comprises a first barrier layer underlying the active region and overlying the substrate; and a second barrier layer overlying the active region.

Aspect 41. The device of any one of aspects 24 to 40, wherein the substrate is a semi-insulating GaAs substrate; the first barrier layer is a p-doped GaAs layer having a thickness from 0.05 µm to 0.15 µm and a doping level from $1 \times 10^{17}$ cm$^{-3}$ to $1 \times 10^{19}$ cm$^{-3}$; the second barrier layer is an n-doped GaAs layer having a thickness from 0.05 um to 0.15 um and a doping level from $1 \times 10^{17}$ cm$^{-3}$ to $1 \times 10^{19}$ cm$^{-3}$; and the active region comprises a GaInNAsSb layer having a bandgap from 0.9 eV to 0.92 eV, a FWHM from 50 nm to 70 nm, and a thickness from 0.05 µm to 0.15 µm.

Aspect 42. The device of aspect 41, wherein an XRD splitting between the GaInNAsSb peak and the GaAs substrate can be from 600 arcsec to 1000 arcsec.

Aspect 43. The device of any one of aspects 41 to 42, wherein the GaInNAsSb layer has a compressive strain of 0.2% to 0.35% with respect to the GaAs substrate.

Aspect 44. The device of any one of aspects 41 to 43, wherein the device comprises: a diameter from 0.75 mm to 1.25 mm; sidewall angles from 70° and 90° perpendicular to the substrate; a responsivity within a range from 0.6 A/W to 0.85 A/W at a wavelength of 1300 nm measured using a broad-band halogen lamp, with light monochromatized with 10 nm wavelength band; and a dark current from 2.5 nA to 4.5 nA. at a bias voltage of 1V, measured at room temperature (25° C.).

EXAMPLES

The following examples describe in detail examples of compounds, devices and methods provided by the present disclosure. It will be apparent to those skilled in the art that many modifications, both to materials and methods, may be practiced without departing from the scope of the disclosure.

Example 1

X-Ray and Photoluminescence Characterization of GaInNAsSb Layers

Figure 6:
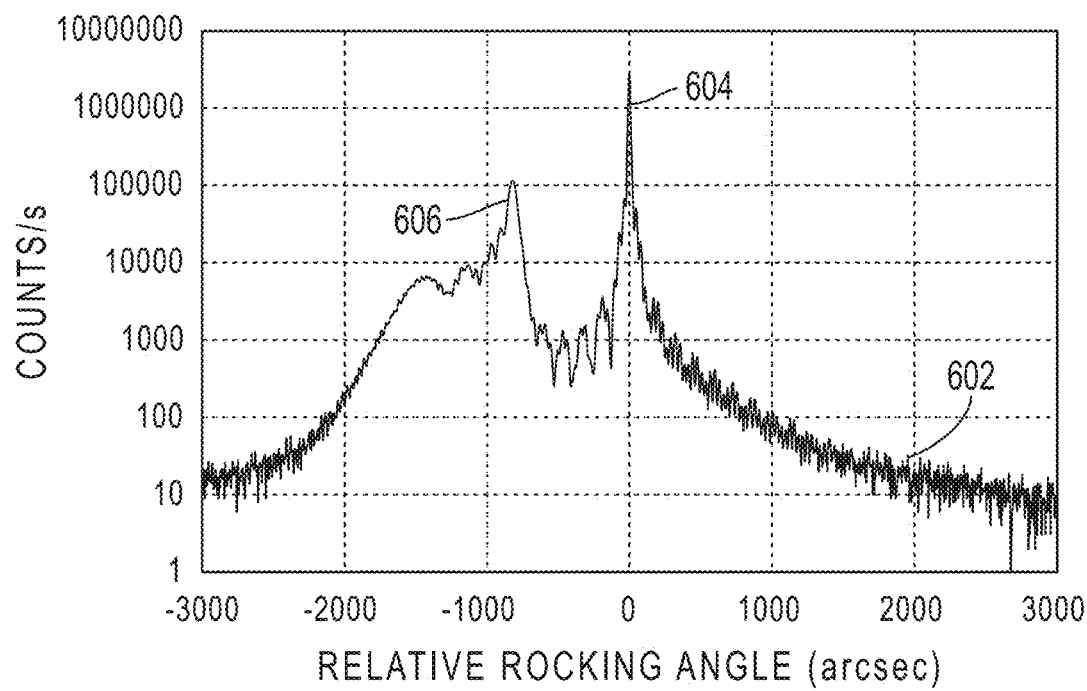
FIG. 6 shows an X-ray diffraction scan of a GaInNAsSb dilute nitride layer formed on a GaAs substrate according to the present invention.
Figure 7:
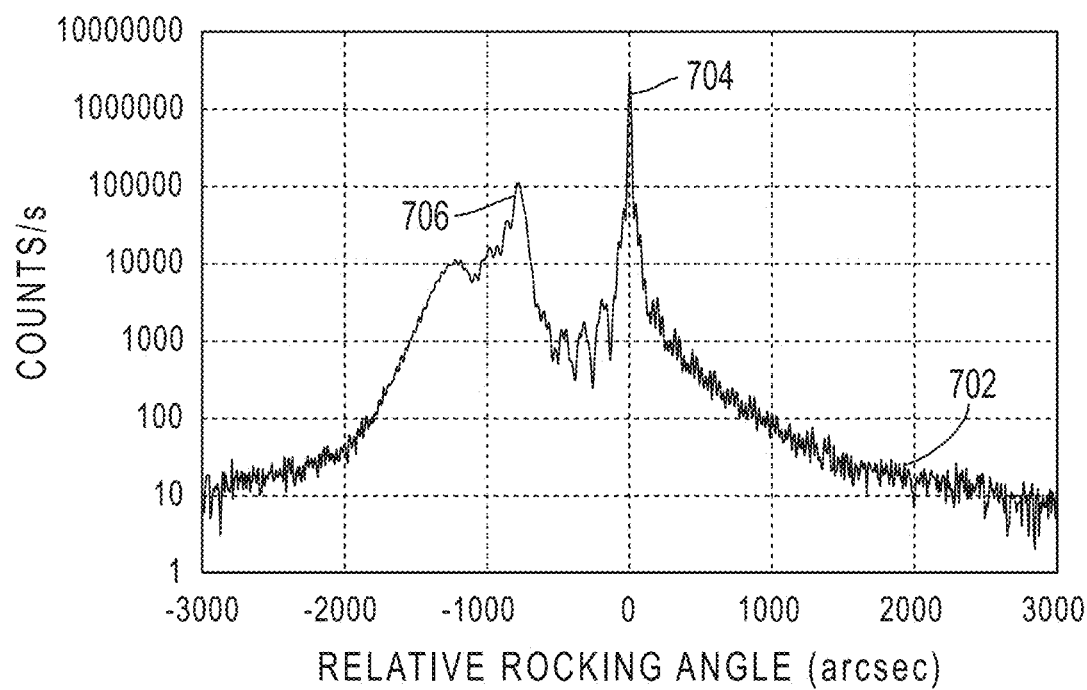
FIG. 7 shows an X-ray diffraction scan of another GaInNAsSb dilute nitride layer formed on a GaAs substrate according to the present invention.

Dilute nitride GaInNAsSb materials, with bandgaps between about 0.8 eV and 0.92 eV suitable for incorporation into photodetectors have been characterized by X-ray diffraction (XRD) and photoluminescence (PL) spectroscopy. The thickness of the dilute nitride absorber layer for these samples was approximately 0.5 µm. FIGS. 6 and 7 show XRD scans for GaInNAsSb layers, with bandgaps of about 0.855 eV and 0.912 eV, respectively, epitaxially formed using MBE on GaAs substrates. The GaInNAsSb layers are pseudomorphic layers (non-relaxed).

As shown in FIG. 6, scan 602 for the 0.855 eV material has two peaks 604 and 606, indicating the presence of two different lattice parameters. Peak 604 corresponds to the lattice parameter for the GaAs substrate and peak 606 corresponds to the lattice parameter for the GaInNAsSb layer. Peak 606 is shifted by about −820 arcsec from peak 608, indicating that the GaInNAsSb layer is compressively strained with respect to GaAs.

As shown in FIG. 7, scan 702 for the 0.912 eV material has two peaks 704 and 706, indicating the presence of two different lattice parameters. Peak 704 corresponds to the lattice parameter of the GaAs substrate and peak 706 corresponds to the lattice parameter of the GaInNAsSb layer. Peak 706 is shifted by about −780 arcsec from peak 708, indicating the GaInNAsSb layer is compressively strained with respect to GaAs.

The narrowness of peaks 604, 606, 704, and 706 indicates that the GaInNAsSb layers have high crystallinity and low defect levels.

Figure 8:
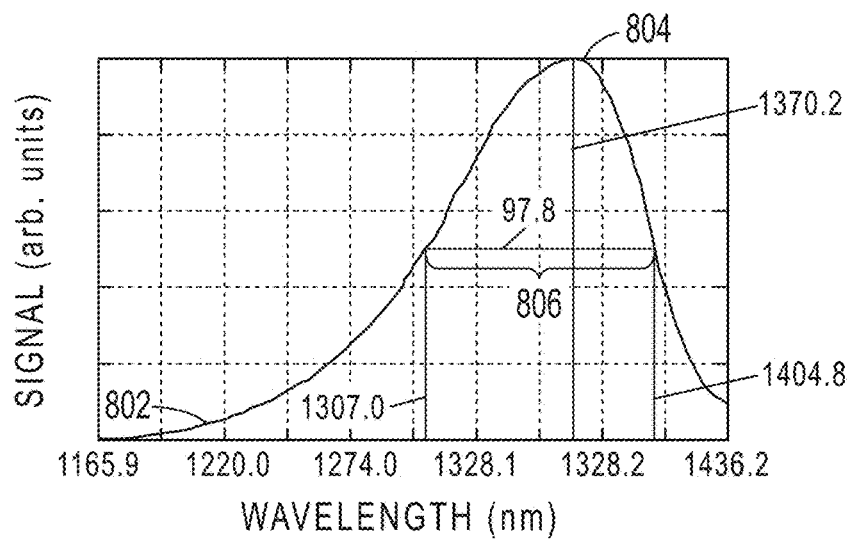
FIG. 8 shows a photoluminescence spectrum for a GaInNAsSb layer grown on a GaAs substrate according to the present invention.
Figure 9:
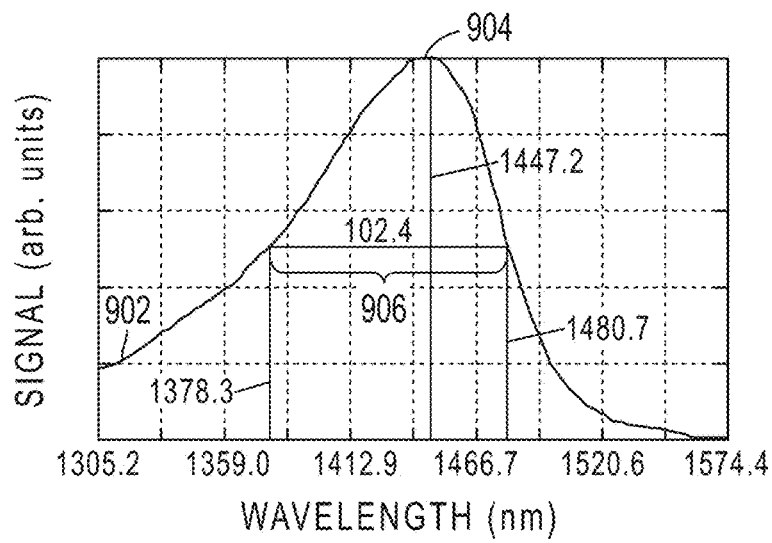
FIG. 9 shows a photoluminescence spectrum for another GaInNAsSb layer grown on a GaAs substrate according to the present invention.
Figure 10:
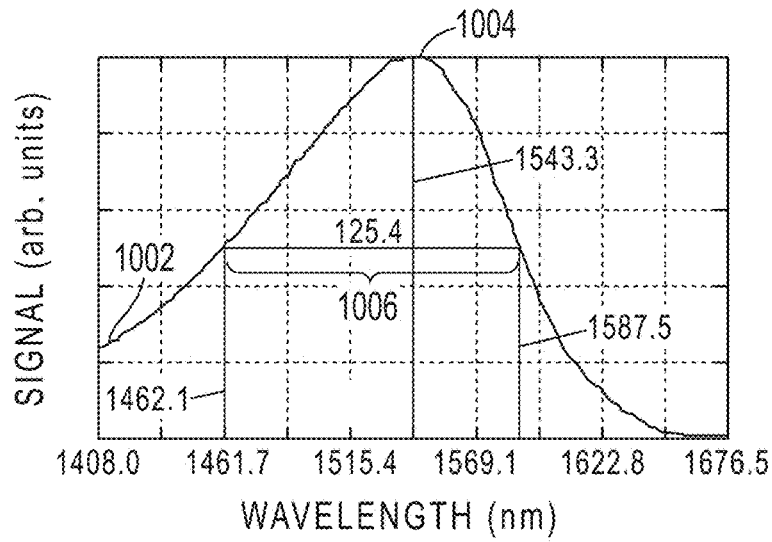
FIG. 10 shows a photoluminescence spectrum for another GaInNAsSb layer grown on a GaAs substrate according to the present invention.

FIGS. 8, 9 and 10 show PL spectra for different GaInNAsSb material samples with bandgaps between about 0.8 eV and 0.92 eV.

As shown in FIG. 8, scan 802 includes a peak 804 at a wavelength of 1370.2 nm, corresponding to an energy of about 0.905 eV. Scan 802 includes a full-width-half-maximum (FWHM) 806 of 97.8 nm. This narrow FWHM indicates good material quality.

As shown in FIG. 9, scan 902 includes a peak 904 at a wavelength of 1447.2 nm, corresponding to an energy of about 0.857 eV. Scan 902 includes a full-width-half-maximum (FWHM) 906 of 102.4 nm. This narrow FWHM indicates good material quality.

As shown in FIG. 10, scan 1002 includes a peak 1004 at a wavelength of 1543.3 nm, corresponding to an energy of about 0.803 eV. Scan 1002 includes a full-width-half-maximum (FWHM) 1006 of 125.4 nm. This narrow FWHM also indicates good material quality.

Example 2

GaInNAsSb-Based Photodetectors Grown on GaAs

Photodetectors incorporating a dilute nitride layer comprising GaInNAsSb and having bandgaps within a range from 0.9 eV to 0.92 eV were fabricated. The $Ga_{1-x}In_xN_yAs_{1-y-z}Sb_z$ had a composition in which $0.12 \leq x \leq 0.24$, $0.03 \leq y \leq 0.07$ and $0.001 \leq z \leq 0.02$, such as $0.13 \leq x \leq 0.2$, $0.03 \leq y \leq 0.045$ and $0.001 \leq z \leq 0.02$, or $0.13 \leq x \leq 0.18$, $0.03 \leq y \leq 0.04$ and $0.001 \leq z \leq 0.02$. The structure of the photodetectors is shown in FIG. 4. Photoluminescence (PL) measurements for the dilute nitride layers exhibited a full-width half maximum within a range from 50 nm to 70 nm. The thickness of the dilute nitride layers was within a range from 0.5 µm to 1.5 µm. The photodetector structures included a semi-insulating (SI) GaAs substrate. The first contact layer was a p-doped GaAs layer with a thickness of 1 µm, and a doping level of $5 \times 10^{18}$ $cm^{-3}$. The first barrier layer was a p-doped GaAs layer with a thickness of 0.1 µm, and a doping level of $1 \times 10^{18}$ $cm^{-3}$. The active layer was an intrinsic (or unintentionally doped) GaInNAsSb layer. The second barrier layer was an n-doped GaAs layer with a thickness of 0.1 µm, and a doping level of $1 \times 10^{18}$ $cm^{-3}$. The second contact layer is an n-doped GaAs layer with a thickness of 50 nm and a doping level of $1 \times 10^{19}$ $cm^{-3}$. The strain of the dilute nitride layer was characterized using high-resolution X-ray diffraction (XRD) and exhibited a peak splitting between the substrate and dilute nitride layer within a range from −600 arcsec to −1000 arcsec, corresponding to a compressive strain of 0.2% to 0.35%. Devices with active layers with compressive strain up to 0.4% are also possible. Photodetectors with diameters within a range from 20 µm to 3 mm were also fabricated.

Detectors, and arrays of detectors, were fabricated by etching through the dilute nitride materials to form mesa structures, with device diameters up to about 1 mm. Methods to etch dilute nitride materials include wet etch processes such as those described in U.S. Pat. Nos. 9,263,611 and 9,627,561, each of which is incorporated by reference in its entirety, and dry etching techniques such as using an inductance-coupled plasma (ICP). The etch process can be configured to provide smooth sidewalls, with sidewall angles between about 80° and 90° (perpendicular to the substrate), or between about 70° and 90°.

Figure 11A:
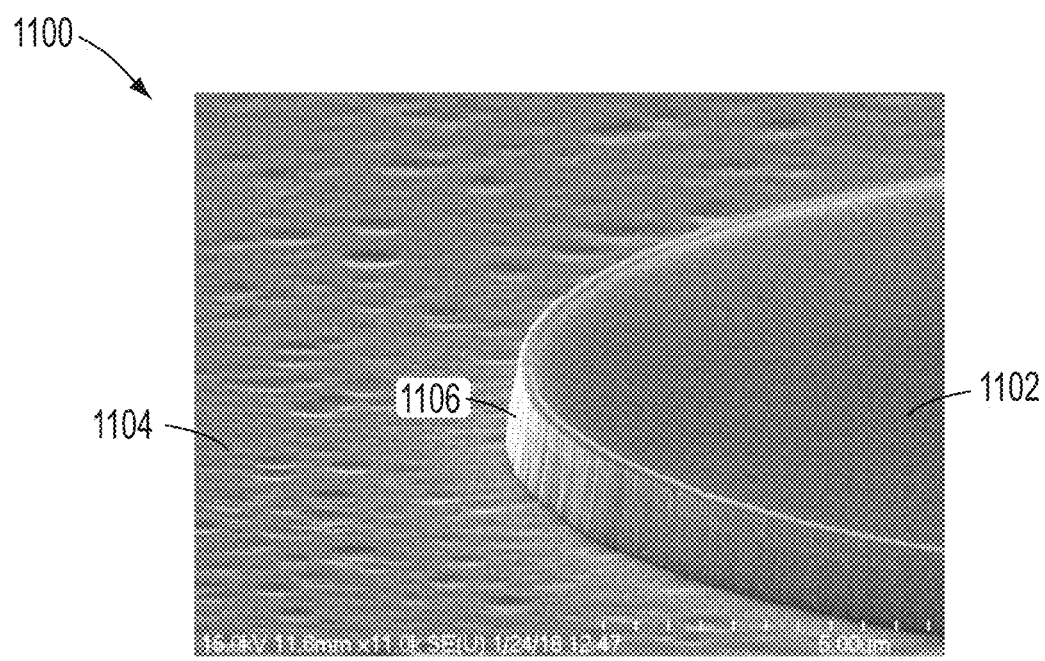
FIG. 11A shows a scanning electron microscopy (SEM) image of an etched mesa for a GaInNAsSb dilute nitride photodetector.

FIG. 11A shows a scanning electron microscopy (SEM) image of a GaInNAsSb dilute nitride material etched using an ICP etch, forming a mesa 1100. Mesa 1100 has a top surface 1102, a bottom surface 1104, and a sidewall 1106 having a sidewall angle with respect to the surface. The sidewall angle is less than 90° but greater than 80°. Standard passivation and metallization steps known in the art were used to complete the devices.

Figure 11B:
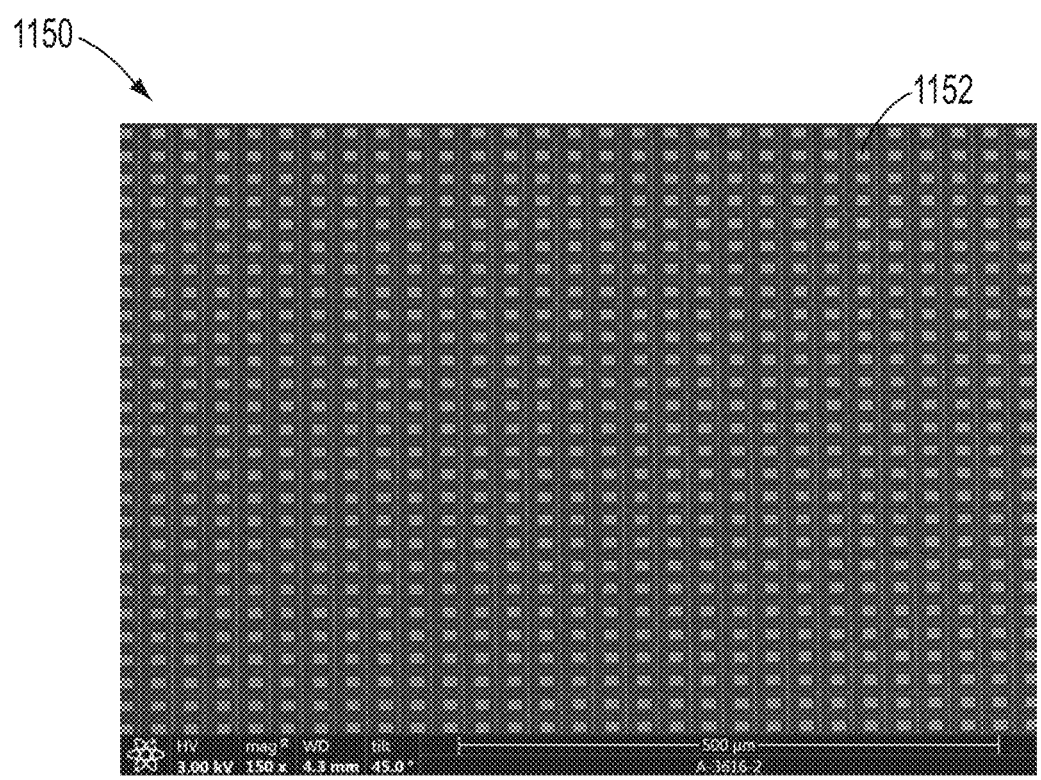
FIG. 11B shows a scanning electron microscopy image of an array of photodetectors according to the present invention.

FIG. 11B shows a scanning electron microscopy image of part of an array of GaInNAsSb dilute nitride photodetectors 1150. Array 1150 is formed by a two-dimensional array of photodetector mesa structures 1152. Arrays of 320 by 256 detector elements or pixels have been fabricated. The sidewall angles allow closely spaced photodetectors. In some embodiments, the length and width of mesa 1100 may each be approximately 6 µm. In some embodiments, the minimum mesa pitch may be 30 µm. In other embodiments, the minimum mesa pitch may be 12 µm.

Figure 12:
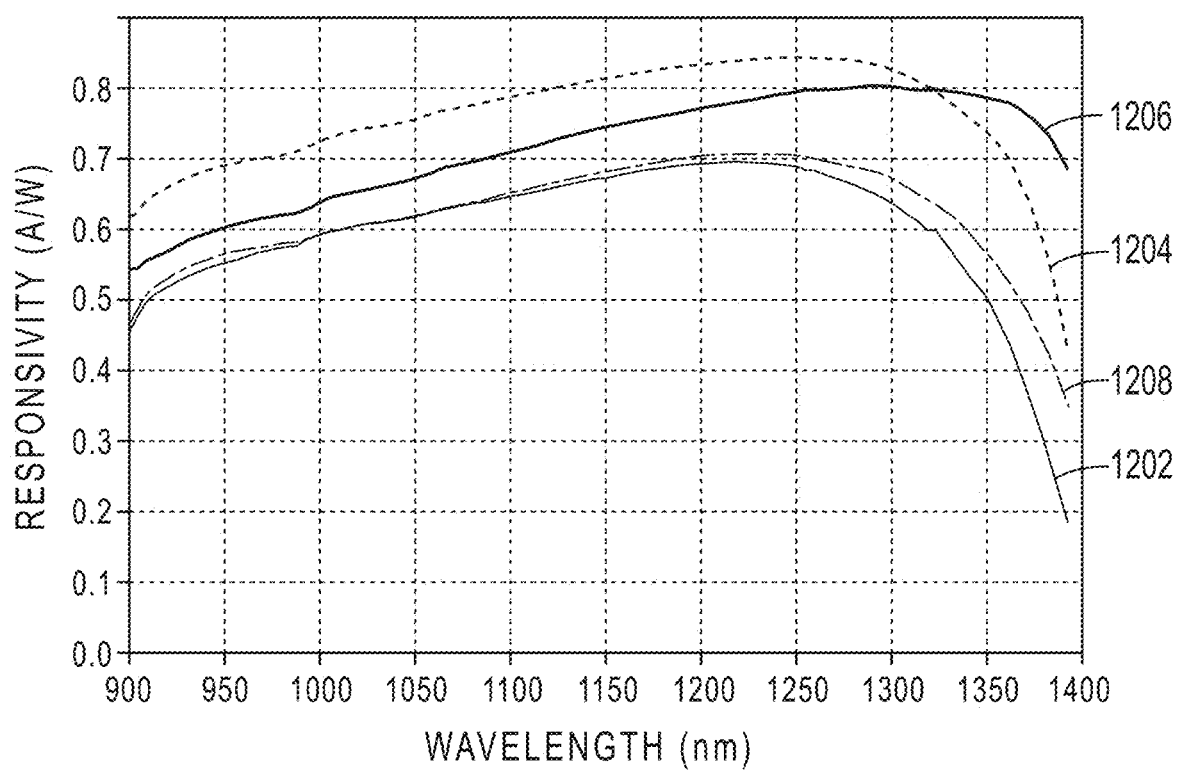
FIG. 12. shows measured responsivity curves for photodetectors according to the present invention.

FIG. 12 shows responsivity curves for four (4) photodetectors fabricated according to the present invention. Devices were fabricated by growing a GaInNAsSb on a GaAs substrate by MBE. The GaInNAsSb layer was compressively strained, with an XRD peak splitting of 600 arcsec or 800 arcsec between the GaInNAsSb dilute nitride peak and the GaAs substrate peak.

Responsivities within a range from 0.6 A/W to 0.85 A/W (at a wavelength of 1300 nm) were measured for these photodetectors. Responsivity curve 1202 is for a device having a 0.5 µm-thick GaInNAsSb dilute nitride layer and with an XRD peak splitting of 600 arc sec. Responsivity curve 1204 is for a device having a 1 µm-thick GaInNAsSb dilute nitride layer and with an XRD peak splitting of 600 arc sec. Responsivity curve 1206 is for a device having a 1.5 µm-thick GaInNAsSb dilute nitride layer and with an XRD peak splitting of 600 arc sec. Responsivity curve 1208 is for a device having a 0.5 µm thick dilute nitride layer and with an XRD peak splitting of 800 arc sec. Responsivity was measured using a broad-band halogen lamp, with light monochromatized with 10 nm wavelength steps, and calibrated using a NIST traceable InGaAs detector.

Photodetectors having a diameter of 1 mm exhibited dark currents as low as 3.6 nA at a bias voltage of 1V, measured at room temperature (25° C.).

To assess GaInNAsSb material quality, GaInNAsSb layers were grown on undoped GaAs, with thicknesses within a range from 250 nm and 2 µm. The GaInNAsSb layers were capped with GaAs. Time-resolved photoluminescence (TRPL) measurements were performed at room temperature (25° C.) to determine the minority carrier lifetime of the GaInNAsSb layer. TRPL is a contactless method used to characterize recombination and carrier transport in photovoltaic materials. Minority carrier lifetime for a material can be influenced by parameters including the background carrier concentration, as well as by defects that can cause non-radiative effects and carrier trapping. Lower background carrier concentrations and/or a lower number of defects can result in a longer minority carrier lifetime, which is indicative of high quality semiconductor material. The TRPL kinetics were measured at room temperature (25° C.) at an excitation wavelength of 970 nm, with an average CW power of 0.250 mW, and a pulse duration of 200 fs generated by a Ti:Sapphire:OPA laser. The pulse repetition rate was 250 kHz. The laser beam diameter at the sample was approximately 1 mm. Whereas typical dilute nitride materials have been reported with minority carrier lifetimes below 1 ns, materials according to the present invention have higher carrier lifetime values, with carrier lifetimes between approximately 1.1 ns and 2.5 ns. Certain GaInNAsSb layers exhibited a minority carrier lifetime greater than 2 ns While background carrier concentrations of less than about $10^{16}$ $cm^{-3}$ and as low as about $10^{15}$ $cm^{-3}$ have been reported, for example, in U.S. Publication No. 2009/0014061, these materials exhibit minority carrier lifetimes of less than 1 ns. This indicates that background carrier concentration alone does not determine the minority carrier lifetime but that the number or concentration of defects within the material can act as recombination centers. Although not contributing to the background carrier concentration, these defects can degrade the electrical and optical properties of the materials, resulting in reduced carrier lifetimes and inferior device performance. Minority carrier lifetimes greater than 1 ns therefore indicate lower levels of these defects and it is believed that the low defect density of the GaInNAsSb materials disclosed herein contributes to the significantly higher responsivities than previously thought achievable for dilute nitride-based photodetectors.

Semiconductor devices of the present disclosure, such as photodetectors comprising III-V semiconductor layers can be grown on either a GaAs or a Ge substrate. The lattice constants of GaAs and Ge are 5.65 Å and 5.66 Å, respectively, and growth of III-V materials with similar compositions without defects can be grown on either substrate. The close matching of the lattice constants of Ge and GaAs allows, for example, high-quality GaAs to be epitaxially grown on a Ge surface.

Figure 13A:
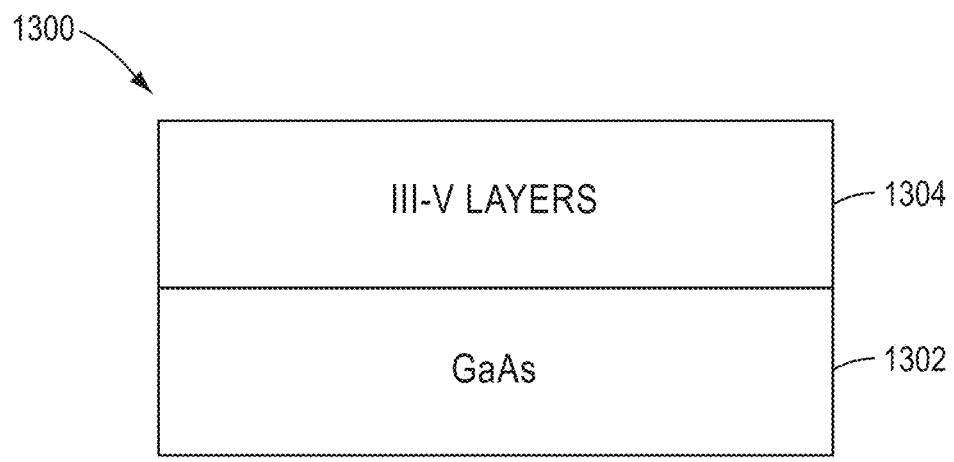
FIG. 13A shows a schematic of a device having II-V semiconductor layers grown on a GaAs substrate.
Figure 13B:
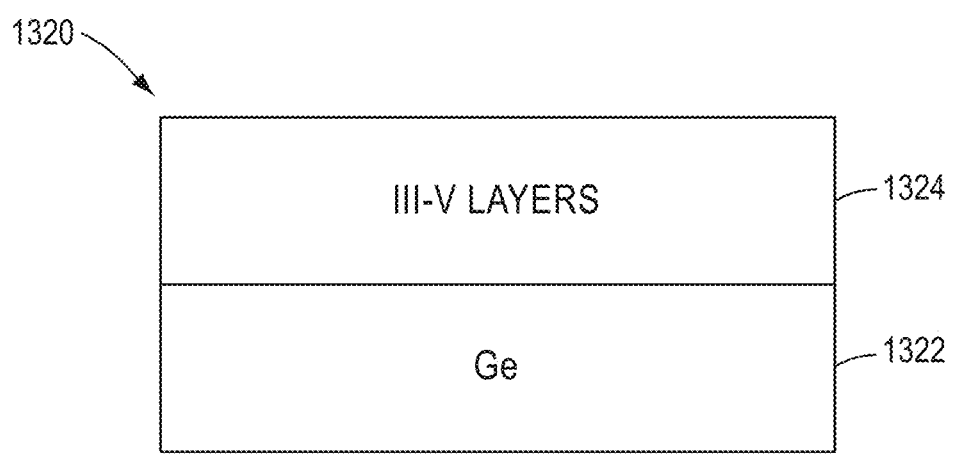
FIG. 13B shows a schematic of a device having II-V semiconductor layers grown on a Ge substrate.

FIGS. 13A and 13B depict semiconductor devices 1300 and 1320, respectively. Semiconductor device 1300 comprises III-V compound semiconductor layers 1304 epitaxially formed over a GaAs substrate 1302, and semiconductor device 1320 comprises semiconductor layers 1324 formed over a Ge substrate 1322. Semiconductor layers 1304 and 1324 are grown lattice matched or pseudomorphically strained to the substrate, ensuring the formation of high quality III-V layers.

The III-V material can also be grown on a substrate having a lattice constant closely matching that of GaAs or Ge, such as a buffered substrate. Examples of buffered silicon substrates that can provide a lattice constant approximately equal to that of GaAs or Ge include SiGe buffered Si, SiGeSn buffered Si, and rare-earth (RE) buffered Si, such as a rare-earth oxide (REO) buffered Si. As will be understood by one of ordinary skill in the art, a layer such as SiGe, SiGeSn, or a RE-containing layer can form a buffer layer (or lattice engineered layer) grown on a substrate such as Si having a low number of defects and/or dislocations in the lattice engineered layer. The buffer layer can provide a lattice constant at the top of the buffer layer approximately equal to that of a GaAs or Ge substrate, facilitating the ability to form high quality III-V layers on top of the buffer layer, with a low number of defects and/or dislocations in the III-V semiconductor layers and/or dilute nitride layers. A low number of defects can include comparable or fewer defects than would occur in an $In_{0.53}Ga_{0.47}As$ layer grown on an InP substrate.

Figure 14A:
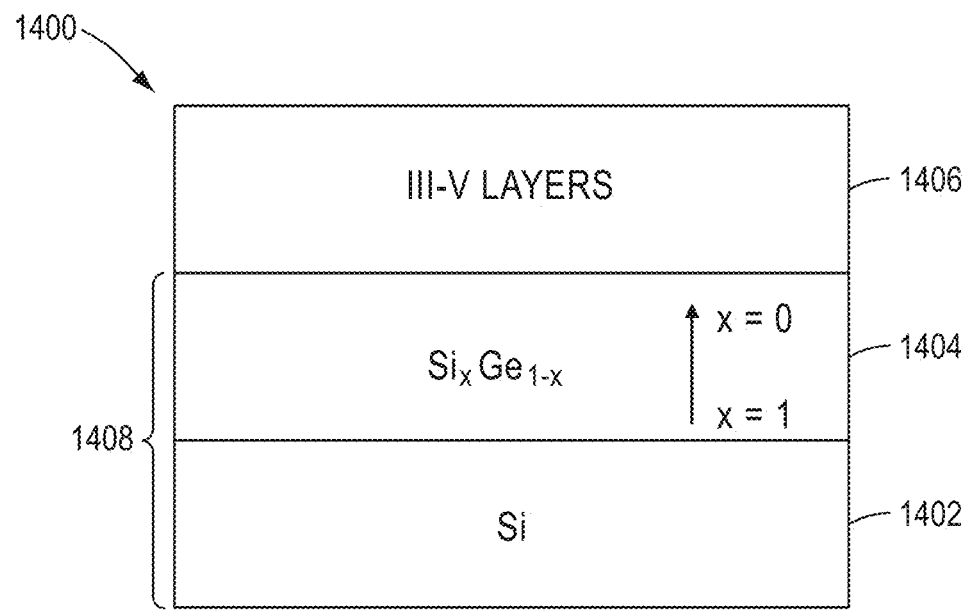
FIG. 14A shows a semiconductor device having a lattice engineered SiGe buffer layer over a silicon substrate.
Figure 14B:
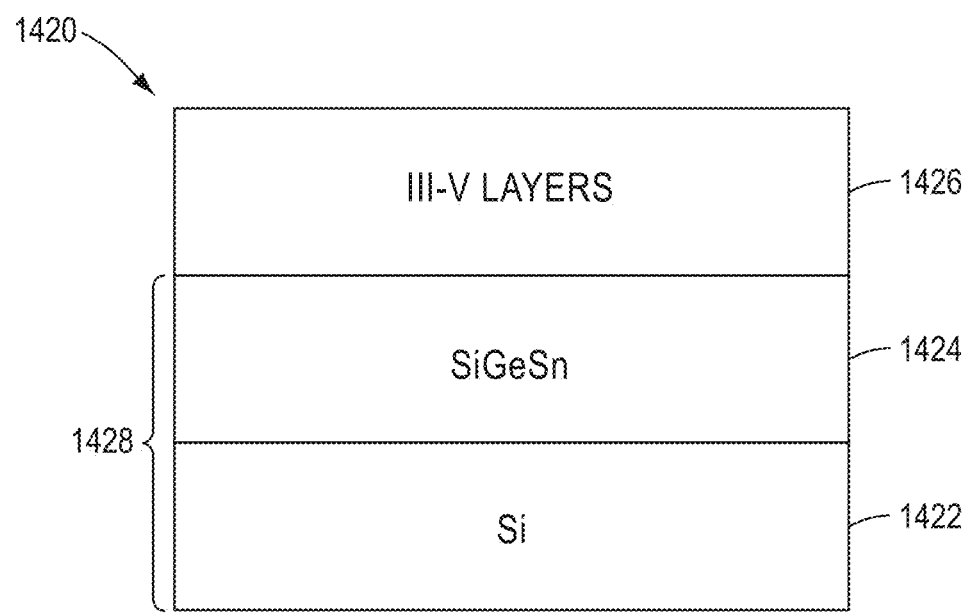
FIG. 14B shows a semiconductor device having a lattice engineered SiGeSn buffer layer over a silicon substrate.
Figure 15:
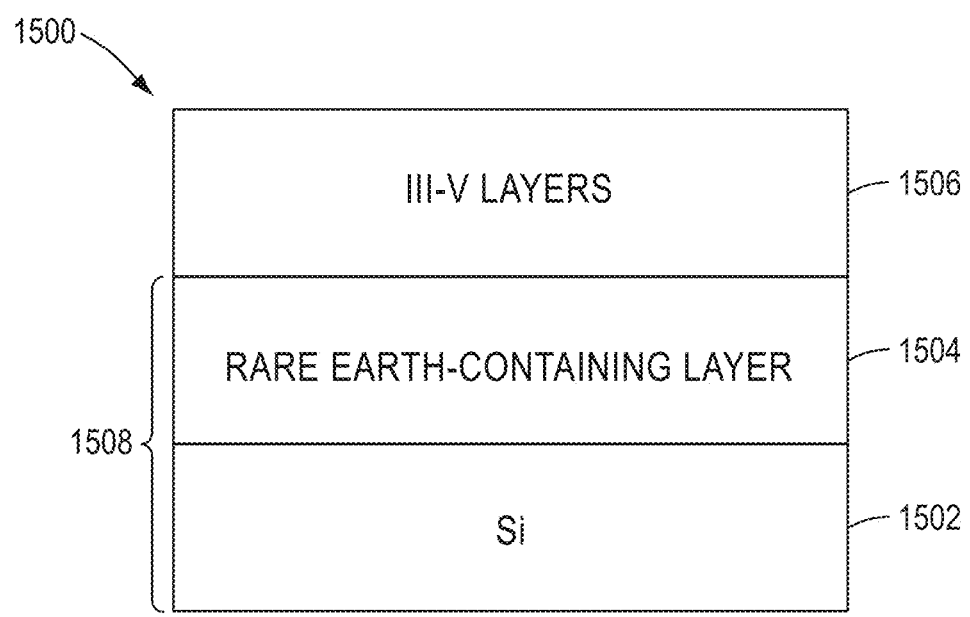
FIG. 15 shows a semiconductor device having a lattice engineered rare earth-containing buffer layer over a silicon substrate.

FIGS. 14A, 14B and 15 show examples of III-V materials, such as photovoltaic cells, photodetectors and power converters formed over buffered substrates with lattice parameters matching or nearly matching the lattice constant for GaAs or Ge.

FIGS. 14A and 14B depict semiconductor devices 1400 and 1420, respectively, comprising a lattice engineered buffer layer over a silicon substrate. Device 1400 comprises a silicon substrate 1402, a graded $Si_xGe_{1-x}$ (0≤x≤1) buffer layer 1404 overlying the Si substrate and III-V compound semiconductor layers 1406 overlying the SiGe buffer layer 1404. The Si fraction x of the graded $Si_xGe_{1-x}$ layer 1404 varies from 0 to 1 through the layer thickness. At the interface with the Si substrate 1402, x=1 and the graded $Si_xGe_{1-x}$ layer 1404 substantially only contains Si. At the interface with the III-V layers 1406, x=0 and the graded $Si_xGe_{1-x}$ layer 1404 substantially only contains Ge. Thus, the graded $Si_xGe_{1-x}$ layer 1404 provides a transition in lattice parameter from that of the Si substrate (5.43 Å) to that of Ge (5.66 Å), which nearly matches to that of GaAs (5.65 Å). Thus, the graded $Si_xGe_{1-x}$ layer 1404 allows for growth of GaAs layers on Si substrates. Together, the graded $Si_xGe_{1-x}$ layer 1404 and the silicon substrate 1402 comprise a substrate 1408 having a top surface with a lattice parameter nearly matching GaAs or Ge.

As shown in FIG. 14B, device 1420 comprises a silicon substrate 1422, a SiGeSn buffer 1424 overlying the Si substrate and III-V compound semiconductor layers 1426 overlying the buffer 1424. The SiGeSn buffer layer 1424 can be formed according to the method described in U.S. Pat. No. 8,029,905 and can provide a lattice constant approximately equal to that of GaAs or Ge at the interface with the overlying III-V layers 1426, thereby allowing for the growth of GaAs layers on Si substrates. Together, the SiGeSn layer 1424 and the silicon substrate 1432 comprise a substrate 1428 having a top surface with a lattice parameter nearly matching that of GaAs and Ge.

FIG. 15 depicts a semiconductor device 1500 comprising a lattice engineered buffer layer over a silicon substrate. Device 1500 comprises a silicon substrate 1502, a rare-earth (RE) containing buffer 1504 epitaxially formed overlying the Si substrate and III-V compound semiconductor layers 1506 overlying the buffer 1504. The RE-containing layer 1504 is a lattice engineered layer. Rare earth elements are a specific class of elements on the periodic table (Sc, Y, La, Ce, Pr, Nd, Pm, Sm, Eu, Gd, Tb, Dy, Ho, Er, Tm, Yb, Lu). The RE containing layer can contain one or more of the rare earth elements. Generically, the RE containing layer can be a rare earth oxide (REO), a rare earth silicide (RESi), or a pnictide (RE-V, where V represents a group V element from the periodic chart, namely N, P, As, Sb, or Bi) or any combination of REO, RESi, and/or pnictide. The composition of the RE-containing layer can be selected to result in a lattice parameter matching or nearly matching GaAs at its interface with an overlying III-V layer 1506. For example, the layer at the interface can be $ErAs_xNi_{1-x}$, where x is approximately 0.9, which is lattice matched or nearly matched to GaAs. The RE-containing layer can have constant composition or a graded composition throughout the layer thickness. When graded, the RE-containing layer can be engineered so that the portion nearest the Si is chemically and mechanically compatible with silicon. For example, gadolinium oxide could be employed at or near the interface between the silicon and rare earth containing layer due to its lattice match with silicon. Thus, the RE-containing layer 1504 can provide a template for epitaxial growth of III-V layers 1506. Together, the RE-containing layer 1504 and the silicon substrate 1502 comprise a substrate 1508 having a top surface with a lattice parameter matching or nearly matching that of GaAs or Ge.

The substrates shown in FIGS. 13A to 15 can be used in any of the semiconductor devices shown in FIGS. 1 to 4.

Finally, it should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. A compound semiconductor optoelectronic device, comprising:
  a substrate;
  a first doped III-V layer overlying the substrate;
  an active region overlying the first doped III-V region, wherein,
    the active region comprises a pseudomorphic dilute nitride layer;
    the dilute nitride layer has a bandgap within a range from 0.7 eV and 1.0 eV; and
    the dilute nitride layer has a minority carrier lifetime of 1 ns or greater at a temperature of 25° C.; and
  a second doped III-V layer overlying the active region.

2. The device of claim 1, wherein the dilute nitride layer has a compressive strain within a range from 0% and 0.4% with respect to the substrate.

3. The device of claim 1, wherein the dilute nitride layer has a minority carrier lifetime of 2 ns or greater.

4. The device of claim 1, wherein the substrate comprises GaAs, AlGaAs, Ge, SiGeSn, or buffered Si.

5. The device of claim 1, wherein a difference in lattice constants between the dilute nitride layer and GaAs or Ge is less than 3%.

6. The device of claim 1, wherein the dilute nitride layer comprises GaInNAs, GaNAsSb, GaInNAsSb, GaInNAsBi, GaNAsSbBi, GaNAsBi, or GaInNAsSbBi.

7. The device of claim 1, wherein the dilute nitride layer comprises $Ga_{1-x}In_xN_yAs_{1-y-z}Sb_z$, wherein $0 \le x \le 0.4$, $0 < y \le 0.07$, and $0 < z \le 0.04$.

8. The device of claim 1, wherein the dilute nitride layer comprises $Ga_{1-x}In_xN_yAs_{1-y-z}Sb_z$, where $0.12 \le x \le 0.24$, $0.03 \le y \le 0.07$ and $0.001 \le z \le 0.02$;
$0.12 \le x \le 0.24$, $0.03 \le y \le 0.07$, and $0.005 \le z \le 0.04$;
$0.13 \le x \le 0.20$, $0.03 \le y \le 0.045$ and $0.001 \le z \le 0.02$;
$0.13 \le x \le 0.18$, $0.03 \le y \le 0.04$ and $0.001 \le z \le 0.02$; or
$0.18 \le x \le 0.24$, $0.04 \le y \le 0.07$ and $0.01 \le z \le 0.04$.

9. The device of claim 1, wherein the dilute nitride layer has a thickness within a range from 0.2 μm to 10 μm.

10. The device of claim 1, wherein the device comprises a photodetector.

11. The device of claim 10, wherein the photodetector has a responsivity greater than 0.6 A/W at 1300 nm.

12. The device of claim 10, wherein the photodetector has a responsivity greater than 0.8 A/W at 1300 nm.

13. The device of claim 1, wherein the device comprises a light emitting diode.

14. A method of forming a semiconductor optoelectronic device, comprising:
forming a substrate;
forming a first doped III-V layer overlying the substrate;
forming an active region overlying the first doped III-V layer, wherein,
the active region comprises a pseudomorphic dilute nitride layer;
the dilute nitride layer has a bandgap within a range from 0.7 eV and 1.0 eV; and
the dilute nitride layer has a minority carrier lifetime of 1 ns or greater; and
forming a second doped III-V layer overlying the active region.

15. The method of claim 14, wherein the dilute nitride layer comprises GaInNAs, GaNAsSb, GaInNAsSb, GaInNAsBi, GaNAsSbBi, GaNAsBi, or GaInNAsSbBi.

16. The method of claim 14, wherein the dilute nitride layer comprises $Ga_{1-x}In_xN_yAs_{1-y-z}Sb_z$, wherein $0 \le x \le 0.4$, $0 < y \le 0.07$, and $0 < z \le 0.04$.

17. The method of claim 14, wherein the dilute nitride layer comprises $Ga_{1-x}In_xN_yAs_{1-y-z}Sb_z$, wherein $0.12 \le x \le 0.24$, $0.03 \le y \le 0.07$ and $0.001 \le z \le 0.02$;
$0.12 \le x \le 0.24$, $0.03 \le y \le 0.07$, and $0.005 \le z \le 0.04$;
$0.13 \le x \le 0.2$, $0.03 \le y \le 0.045$ and $0.001 \le z \le 0.02$;
$0.13 \le x \le 0.18$, $0.03 \le y \le 0.04$ and $0.001 \le z \le 0.02$; or
$0.18 \le x \le 0.24$, $0.04 \le y \le 0.07$ and $0.01 \le z \le 0.04$.

18. The method of claim 14, wherein the dilute nitride layer has a thickness within a range from 0.2 μm and 10 μm.

19. The method of claim 14, wherein the substrate comprises GaAs, AlGaAs, Ge, SiGeSn, or buffered Si.

20. The method of claim 14, wherein the dilute nitride layer has a lattice constant less than 3% the lattice constant of GaAs or Ge.

21. The method of claim 14, wherein the dilute nitride layer has a compressive strain within a range from 0% and 0.4% with respect to the substrate.

22. The method of claim 21, wherein the photodetector has a responsivity greater than 0.6 A/W at 1300 nm.

23. The method of claim 21, wherein the photodetector has a responsivity greater than 0.8 A/W at 1300 nm.

24. The method of claim 14, wherein the device comprises a photodetector.

* * * * *